(12) United States Patent
Kim et al.

(10) Patent No.: US 9,054,296 B2
(45) Date of Patent: Jun. 9, 2015

(54) SEMICONDUCTOR DEVICE HAVING DIODE AND METHOD OF FORMING THE SAME

(71) Applicant: SAMSUNG ELECTRONICS CO., LTD., Suwon-si, Gyeonggi-do (KR)

(72) Inventors: Sea-Phyo Kim, Suwon-si (KR); Dong-Bok Lee, Hwaseong-si (KR); Chan-Min Lee, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/096,055

(22) Filed: Dec. 4, 2013

(65) Prior Publication Data

US 2014/0183435 A1 Jul. 3, 2014

(30) Foreign Application Priority Data

Jan. 3, 2013 (KR) .................. 10-2013-0000778
Jan. 24, 2013 (KR) .................. 10-2013-0008164

(51) Int. Cl.
*H01L 29/02* (2006.01)
*H01L 45/00* (2006.01)
*H01L 27/24* (2006.01)

(52) U.S. Cl.
CPC ............ *H01L 45/06* (2013.01); *H01L 45/1233* (2013.01); *H01L 45/143* (2013.01); *H01L 45/144* (2013.01); *H01L 27/2409* (2013.01); *H01L 27/2463* (2013.01)

(58) Field of Classification Search
CPC ......... H01L 45/04; H01L 29/00; H01L 27/24; G11C 13/004

USPC .................. 257/2–5, E29.002; 438/102–104; 365/163

See application file for complete search history.

(56) References Cited

U.S. PATENT DOCUMENTS

| 6,118,135 | A  | * | 9/2000 | Gonzalez et al. ............ 257/3 |
| 7,961,508 | B2 |   | 6/2011 | Choi et al. |
| 8,098,518 | B2 |   | 1/2012 | Kim et al. |
| 8,102,729 | B2 |   | 1/2012 | Lee et al. |
| 8,107,275 | B2 |   | 1/2012 | Choi et al. |
| 8,119,503 | B2 |   | 2/2012 | Lee et al. |
| 2007/0184613 | A1 | | 8/2007 | Kim et al. |
| 2008/0106922 | A1 | | 5/2008 | Park et al. |
| 2009/0237986 | A1 | | 9/2009 | Choi et al. |
| 2009/0285009 | A1 | | 11/2009 | Kim et al. |
| 2010/0014345 | A1 | | 1/2010 | Choi et al. |
| 2010/0019220 | A1 | | 1/2010 | Suh |
| 2010/0061146 | A1 | | 3/2010 | Choi et al. |
| 2010/0110768 | A1 | | 5/2010 | Choi |
| 2010/0163830 | A1 | | 7/2010 | Chang et al. |
| 2010/0181549 | A1 | | 7/2010 | Kim et al. |

(Continued)

FOREIGN PATENT DOCUMENTS

KR 10-2009-0026674 A 3/2009
KR 10-2009-0036413 A 4/2009

(Continued)

*Primary Examiner* — Jami M Valentine
(74) *Attorney, Agent, or Firm* — Lee & Morse, P.C.

(57) ABSTRACT

A semiconductor device includes a conductive line, a diode on the conductive line, one or more insulating patterns adjacent to diode, and a data storage region coupled to the diode. An upper surface of the diode is between the one or more insulating patterns and the data storage region. The data storage region may include a phase-change region, and the diode may taper in width between two insulating patterns in one arrangement.

18 Claims, 39 Drawing Sheets

(56) References Cited

U.S. PATENT DOCUMENTS

| | | |
|---|---|---|
| 2010/0238709 A1 | 9/2010 | Eun et al. |
| 2010/0284213 A1 | 11/2010 | Savransky |
| 2010/0290276 A1 | 11/2010 | Choi |
| 2010/0301480 A1 | 12/2010 | Choi et al. |
| 2010/0323492 A1 | 12/2010 | Lee |
| 2011/0143477 A1 | 6/2011 | Lee et al. |
| 2011/0254103 A1 | 10/2011 | Hwang |

FOREIGN PATENT DOCUMENTS

| | | |
|---|---|---|
| KR | 10-2009-0060593 A | 6/2009 |
| KR | 10-2009-0117232 A | 11/2009 |
| KR | 10-2010-0015105 A | 2/2010 |
| KR | 10-2010-0032582 A | 3/2010 |
| KR | 10-2010-0034412 A | 4/2010 |
| KR | 10-2010-0036450 A | 4/2010 |
| KR | 10-2010-0110633 A | 10/2010 |

\* cited by examiner

SEMICONDUCTOR DEVICE HAVING DIODE AND METHOD OF FORMING THE SAME

CROSS-REFERENCE TO RELATED APPLICATION

Korean Patent Application No. 10-2013-0000778, filed on Jan. 3, 2013, and entitled, "Semiconductor Device Having Diode and Method of Forming the Same," and Korean Patent Application No. 10-2013-0008164, filed on Jan. 24, 2013, and entitled, "Semiconductor Device Having Diode and Method of Forming the Same," are incorporated by reference herein in their entirety.

BACKGROUND

1. Field

One or more embodiments described herein relate to a memory device.

2. Description of Related Art

Various methods have been studied to improve the electrical characteristics and achieve higher integration of memory devices such as a phase-change access memory (PRAM).

SUMMARY

In accordance with one embodiment, a semiconductor device includes a lower interconnection on a substrate, a diode on the lower interconnection, a pair of first insulating patterns adjacent to respective side surfaces of the diode, the pair of first insulating patterns spaced from one another; and a data storage element on the diode, wherein an upper end of the diode protrudes at a higher level than the pair of first insulating patterns. The pair of first insulating patterns cross the lower interconnection.

Also, each of the pair of first insulating patterns has an upper horizontal width smaller than a lower horizontal width.

Also, the pair of first insulating patterns may cross over the lower interconnection, and a lower end of the diode is at a lower level than an upper end of the lower interconnection.

Also, the diode includes a semiconductor layer formed by a selective epitaxial growth (SEG) process or a solid-phase epitaxial growth process. The diode may include a lower part between the pair of first insulating patterns; and an upper part at a higher level than the pair of first insulating patterns, wherein side surfaces of the lower part and upper part are offset relative to each other. The lower part may have substantially an inverted trapezoidal shape, and the upper part may have a substantially trapezoidal shape. The upper part may contact upper surfaces of the par of first insulating patterns.

Also, the device may include a pair of second insulating patterns crossing the pair of first insulating patterns and facing each other, wherein: the diode is between the pair of second insulating patterns, the diode includes first and second side surfaces facing each other and adjacent to the first insulating patterns, and third and fourth side surfaces facing each other and adjacent to the second insulating patterns, and the first and second side surfaces have different slopes from the third and fourth side surfaces.

Also, the first side surface includes a lower side surface and an upper side surface on the lower side surface, and the lower side surface is in contact with a side surface of one of the first insulating patterns, and the upper side surface is at a higher level than the first insulating patterns.

Also, each of the pair of second insulating patterns has an upper horizontal width smaller than a lower horizontal width.

Also, the device may include third insulating patterns on the pair of first insulating patterns and adjacent to the first and second side surfaces, wherein side surfaces of the third insulating patterns have different slopes from the pair of first insulating patterns.

In accordance with another embodiment, a semiconductor device includes a lower interconnection on a substrate; a pair of first insulating patterns facing each other on the lower interconnection; a semiconductor pattern disposed between the first insulating patterns; a pair of second insulating patterns crossing the pair of first insulating patterns and facing each other; and an upper interconnection on the semiconductor pattern, wherein the semiconductor pattern includes first and second side surfaces in contact with the pair of first insulating patterns and facing each other, and third and fourth side surfaces in contact with the pair of second insulating patterns and facing each other, the first and second side surfaces having different slopes from the third and fourth side surfaces.

Also, each of the pair of first insulating patterns has an upper horizontal width smaller than a lower horizontal width, and each of the pair of second insulating patterns has an upper horizontal width greater than a lower horizontal width.

Also, the semiconductor pattern has an upper horizontal width greater than a lower horizontal width when viewed in a first cross-section passing through the first and second side surfaces, and has an upper horizontal width smaller than a lower horizontal width when viewed in a second cross-section passing through the third and fourth side surfaces.

In accordance with another embodiment, a semiconductor device includes a conductive line; a diode on the conductive line; one or more insulating patterns adjacent to diode; and a data storage region coupled to the diode, wherein an upper surface of the diode is between the one or more insulating patterns and the data storage region. The one or more insulating patterns may include a first insulating pattern and a second insulating pattern, with the diode between the first and second insulating patterns.

Also, upper surfaces of the first and second insulating patterns are substantially coplanar. The data storage region includes a phase-change region.

Also, the diode tapers from a first width to a second width in a first direction, and the diode tapers from a third width to a fourth width in a second direction opposite to the first direction, the first and second directions being substantially aligned with an upper surface of the one or more insulating patterns.

BRIEF DESCRIPTION OF THE DRAWINGS

Features will become apparent to those of ordinary skill in the art by describing in detail exemplary embodiments with reference to the attached drawings in which:

FIGS. 18 to 22A, 22C, and 22D, and FIGS. 23 to 28 illustrate views along section lines I-I', II-II', and III-III' in FIG. 3;

DETAILED DESCRIPTION

Figure 1:
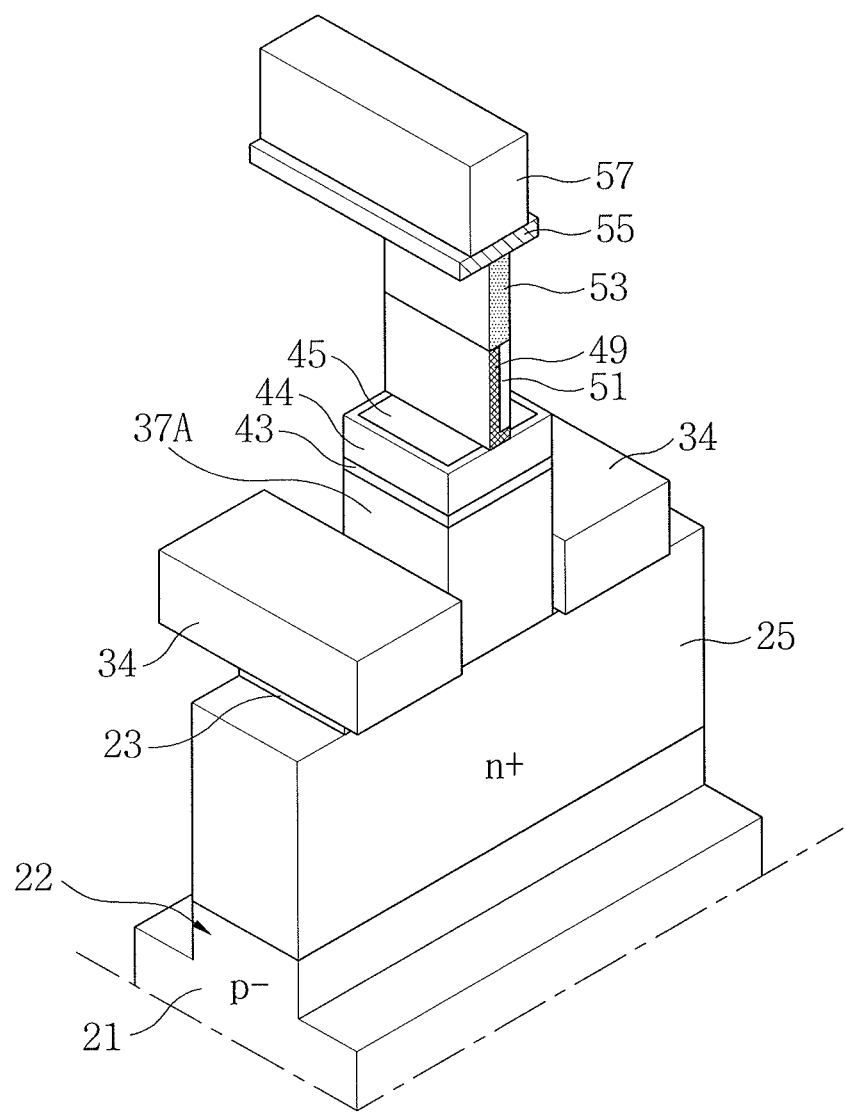
FIG. 1 illustrates an embodiment of non-volatile memory device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
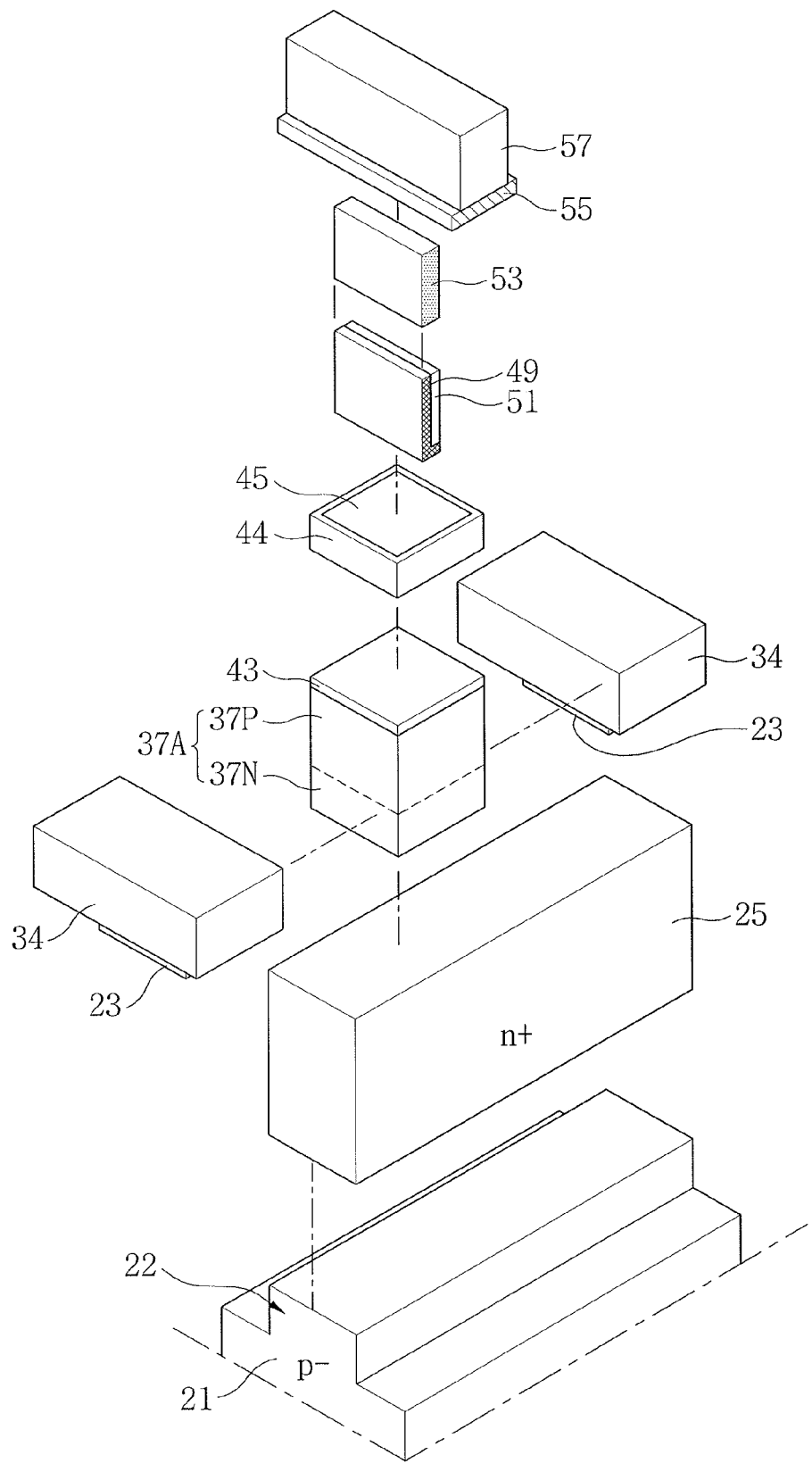
FIG. 2 illustrates an exploded view of FIG. 1.
Figure 3:
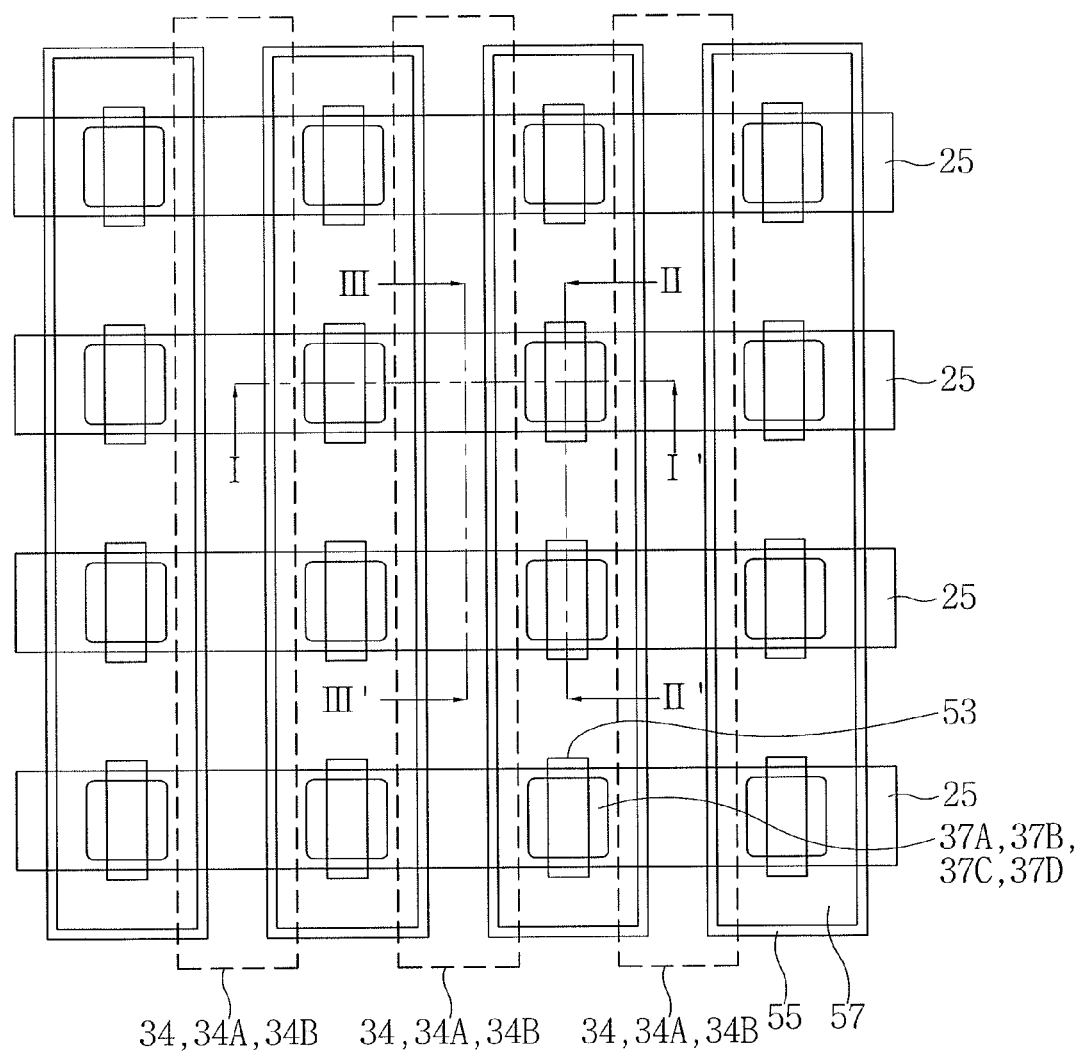
FIG. 3 illustrates an embodiment of a layout for a non-volatile memory device.
Figure 4:
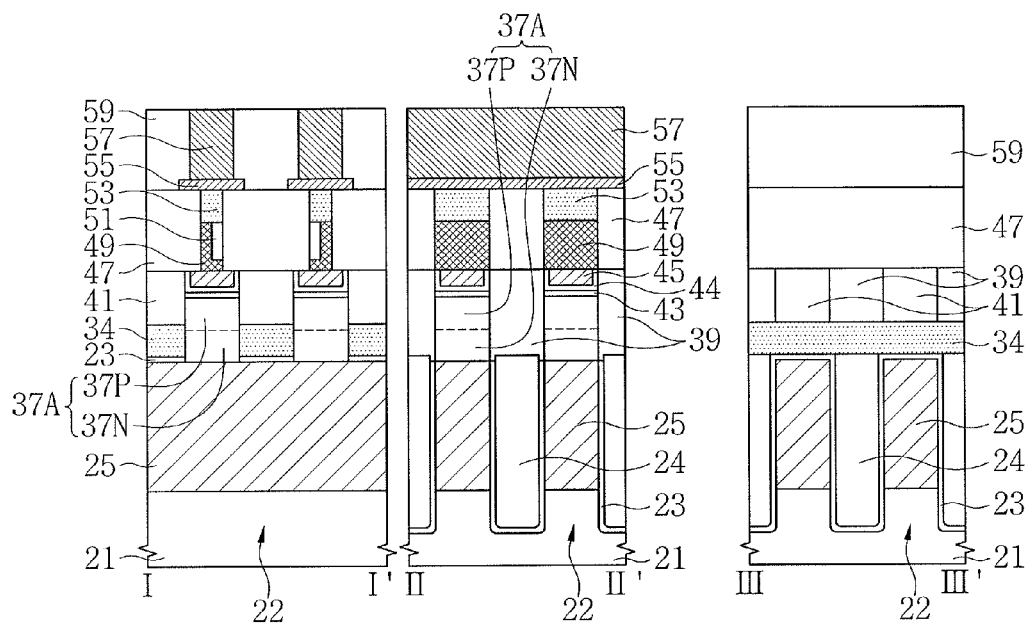
FIGS. 4 to 6 illustrate views along section lines I-I', II-II' and III-III' of FIG. 3.
Figure 5:
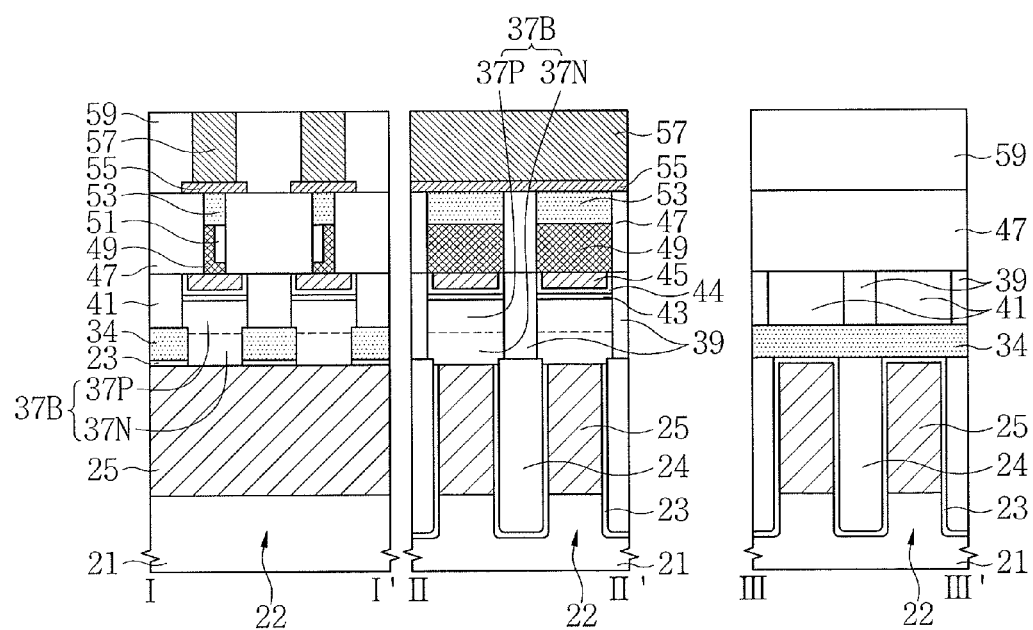
Figure 6:
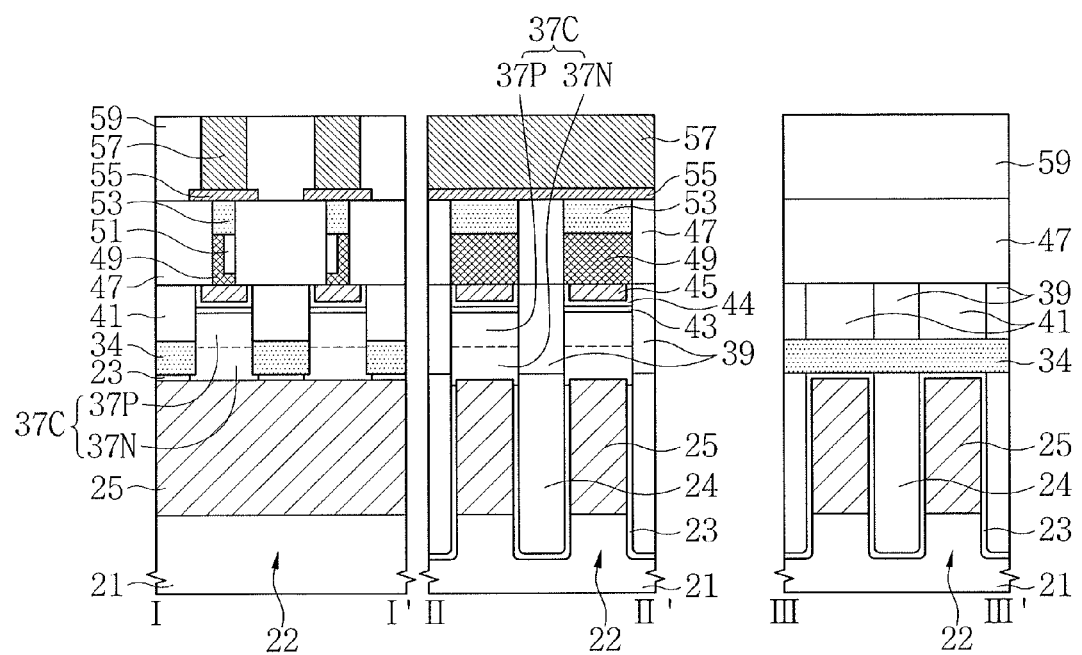

FIG. 1 illustrates a perspective view showing an embodiment of a non-volatile memory device, and FIG. 2 illustrates an exploded perspective view for improved understanding of FIG. 1. In addition, FIG. 3 illustrates an embodiment of a layout of a non-volatile memory device, and FIGS. 4 to 6 illustrate cross-sectional views taken along lines I-I', II-II', and III-III' of FIG. 3. In accordance with one embodiment, the non-volatile memory device is a phase-change access memory (PRAM). However, other embodiments may correspond to a different type of non-volatile memory devices.

Referring to FIGS. 1 and 2, an active region 22 may be defined on the substrate 21. Word-line 25 may be formed on the active region 22. A pair of first insulating patterns 34 may be formed across and over the word-line 25. A first insulating layer 23 may be interposed between the word-line 25 and the first insulating patterns 34. A diode 37A may be in contact with the word-line 25 and may be formed between the first insulating patterns 34. A metal silicide pattern 43 may be formed on the diode 37A. A barrier metal pattern 44 and a conductive pattern 45 may be sequentially formed on the metal silicide pattern 43. A data storage element 49, 51, and 53 may be formed on the conductive pattern 45. The data storage element 49, 51, and 53 may include an electrode structure 49 and 51 and a phase-change pattern 53 disposed on the electrode structure 49 and 51. The electrode structure 49 and 51 may include a lower electrode 49 and a resistive pattern 51. An upper electrode 55 may be formed on the phase-change pattern 53. A bit-line 57 may be formed on the upper electrode 55.

The substrate 21 may be a silicon wafer containing p-type impurities. The active region 22 may be single crystalline silicon containing p-type impurities. The word-line 25 may be single crystalline silicon containing n-type impurities. Side surfaces of the word-line 25 and active region 22 may be vertically aligned. The word-line 25 may be self-aligned on the active region 22. The word-line 25 may have a vertical height greater than a horizontal width.

The diode 37A may be a semiconductor layer formed, for example, by a selective epitaxial growth (SEG) process or a solid-phase epitaxial growth process. The diode 37A may include a first region 37N and a second region 37P. The second region 37P may be formed on the first region 37N. The first region 37N may include n-type impurities. The concentration of the n-type impurities in the first region 37N may be lower than that in the word-line 25. The second region 37P may include p-type impurities. For example, the second region 37P may be single crystalline silicon containing p-type impurities, and the first region 37N may be single crystalline silicon containing n-type impurities. The upper end or surface of the diode 37A may be formed at a higher level than the first insulating patterns 34. The first insulating patterns 34 may be in contact with side surfaces of the diode 37A, and the side surfaces of the diode 37A may be bounded by the first insulating patterns 34.

In other embodiments, the word-line 25 may be referred to as a lower interconnection or a lower semiconductor pattern, and the bit-line 57 may be referred to as an upper interconnection.

Referring to FIG. 3, a plurality of word-lines 25 may be aligned in parallel in a cell-array region of a non-volatile memory device. Upper electrodes 55 may be formed across and over the word-lines 25. Bit-lines 57 may be formed on the upper electrodes 55. The bit-lines 57 may be at right angles to the word-lines 25. Phase-change patterns 53 and diodes 37A, 37B, 37C, and 37D may be foamed at intersections of the word-lines 25 and the bit-lines 57. The diodes 37A, 37B, 37C, and 37D may be formed between first insulating patterns 34, 34A, and 34B parallel to each other. The first insulating patterns 34, 34A, and 34B may cross over the word-lines 25.

Referring to FIGS. 3 and 4, active regions 22 are arranged in parallel on a substrate 21. Word-lines 25 may be formed on the active regions 22. The active regions 22 and the word-lines 25 may be bounded by a first insulating layer 23 and a second insulating layer 24. The first insulating layer 23 may surround side and bottom surfaces of the second insulating layer 24.

First insulating patterns 34 may be arranged in parallel and formed across and over the word-lines 25. The first insulating layer 23 may be retained between the word-lines 25 and the first insulating patterns 34. Diodes 37A in contact with the word-lines 25 may be formed between the first insulating patterns 34. Metal silicide patterns 43 may be formed on the diodes 37A. Barrier metal patterns 44 and conductive patterns 45 may be sequentially formed on the metal silicide patterns 43. Second insulating patterns 39 may be arranged in parallel and formed across the first insulating patterns 34. Third insulating patterns 41 may be formed on the first insulating patterns 34. The third insulating patterns 41 may be formed between the second insulating patterns 39. Side surfaces of the diodes 37A may be in contact with the first insulating patterns 34, the second insulating patterns 39, and the third insulating patterns 41. Side surfaces of the diodes 37A may be bounded by the first insulating patterns 34, the second insulating patterns 39, and the third insulating patterns 41. Each of the diodes 37A may include a first region 37N and a second region 37P.

A molding layer 47 may be formed on the second insulating patterns 39 and the third insulating patterns 41. Data storage elements 49, 51, and 53 passing through the molding layer 47 may be formed. Each of the data storage elements 49, 51, and 53 may include an electrode structure 49 and 51, and a phase-change pattern 53 disposed on the electrode structure 49 and 51. The electrode structure 49 and 51 may include a lower electrode 49 and a resistive pattern 51. An upper insulating layer 59 may be formed on the molding layer 47. Upper electrodes 55 connected to the data storage elements 49, 51, and 53 may be formed in the upper insulating layer 59. Bit-lines 57 may be formed on the upper electrodes 55.

In accordance with one embodiment, the first insulating patterns 34 may function to prevent generation of an Si-fence while allowing a patterning process to be performed for forming the diodes 37A.

Referring to FIGS. 3 and 5, each of the diodes 37B may have an upper horizontal width greater than a lower horizontal width. Some of side surfaces of the diodes 37B may be discontinuous. Each of the diodes 37B may have a greater horizontal width than the word-lines 25.

Referring to FIGS. 3 and 6, each of diodes 37C may extend between the word-lines 25 and the first insulating patterns 34. Each of the diodes 37C may be in contact with upper and side surfaces of the word-lines 25. Lower ends of the diodes 37C may be formed at a lower level than upper ends of the word-lines 25.

Figure 7:
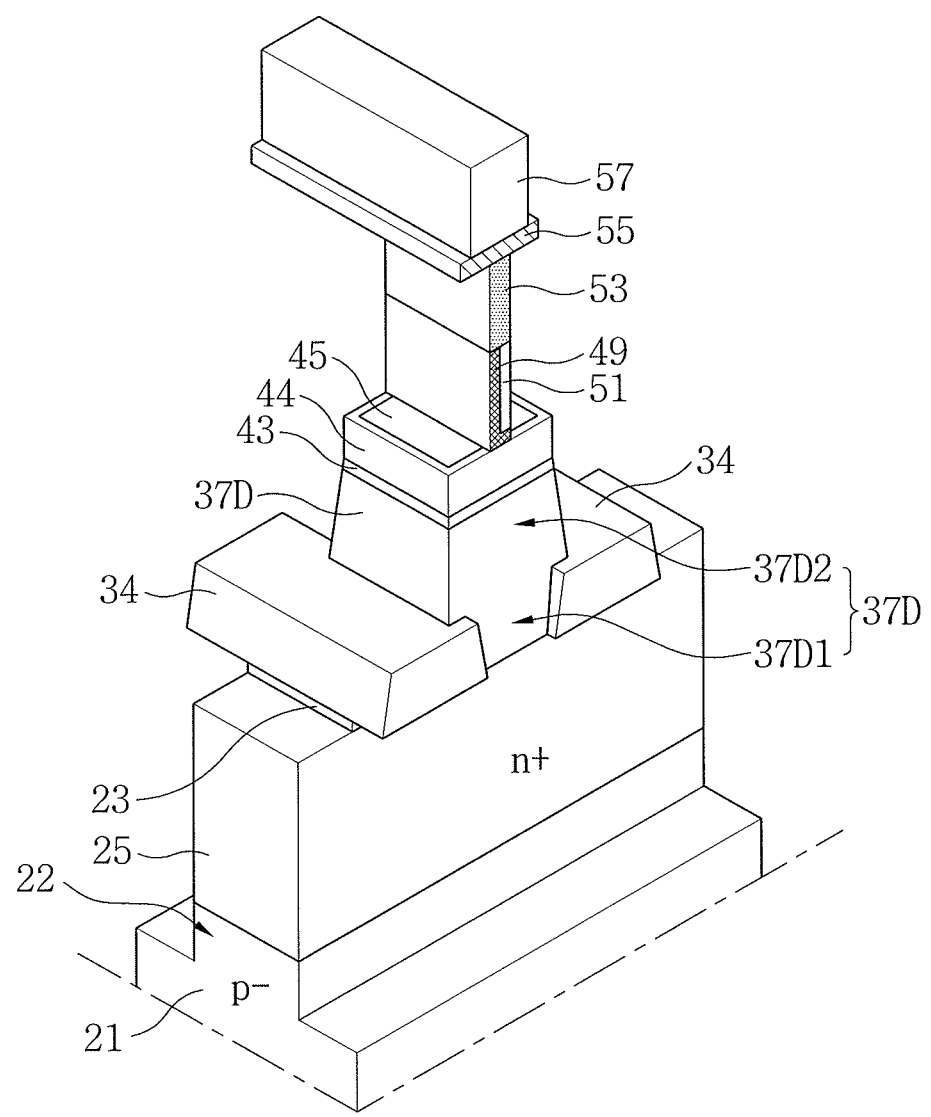
FIG. 7 illustrates a perspective view showing a main configuration of a non-volatile memory device in accordance with embodiments of the inventive concept.
Figure 8:
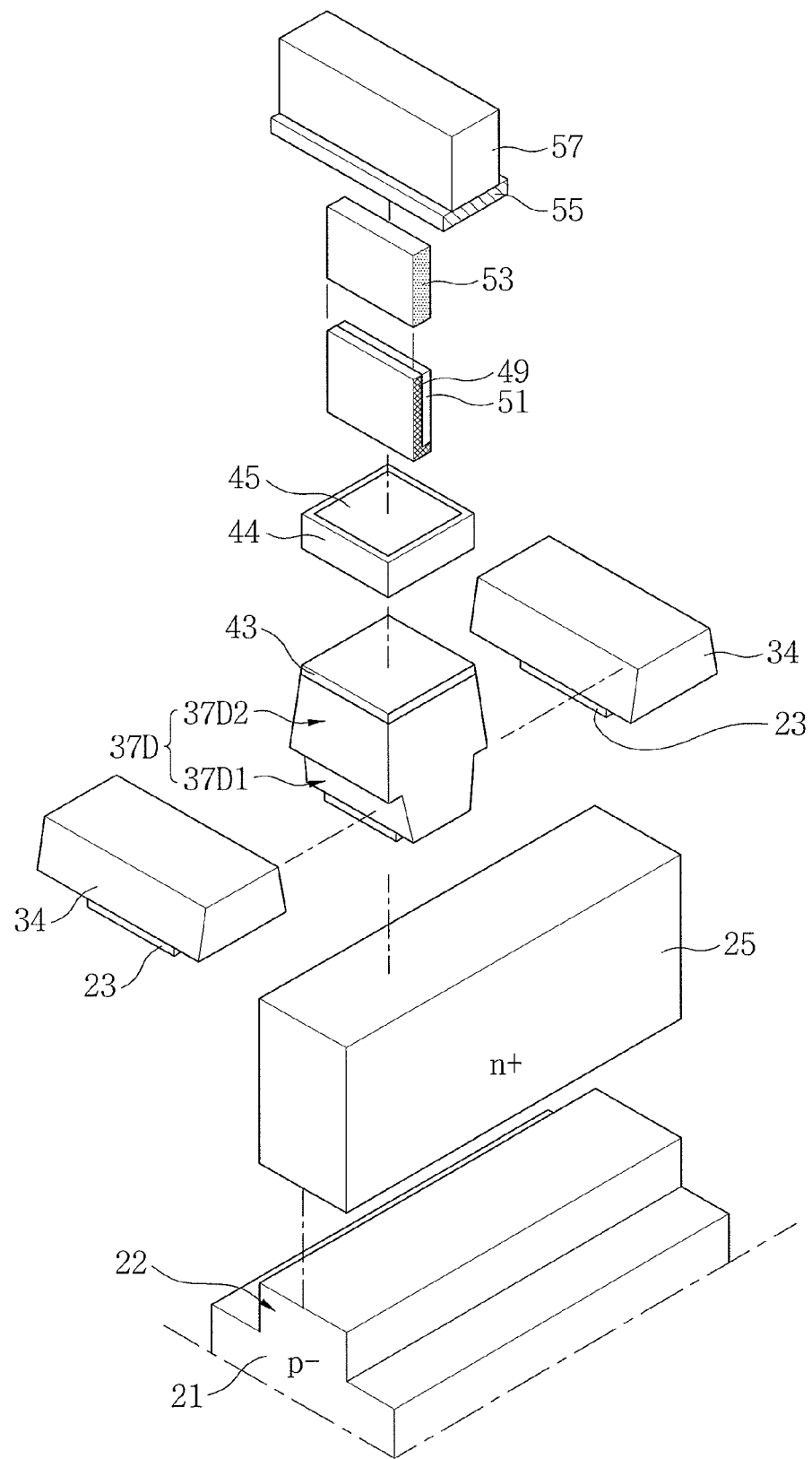
FIG. 8 illustrates an exploded view of FIG. 7.
Figure 9:
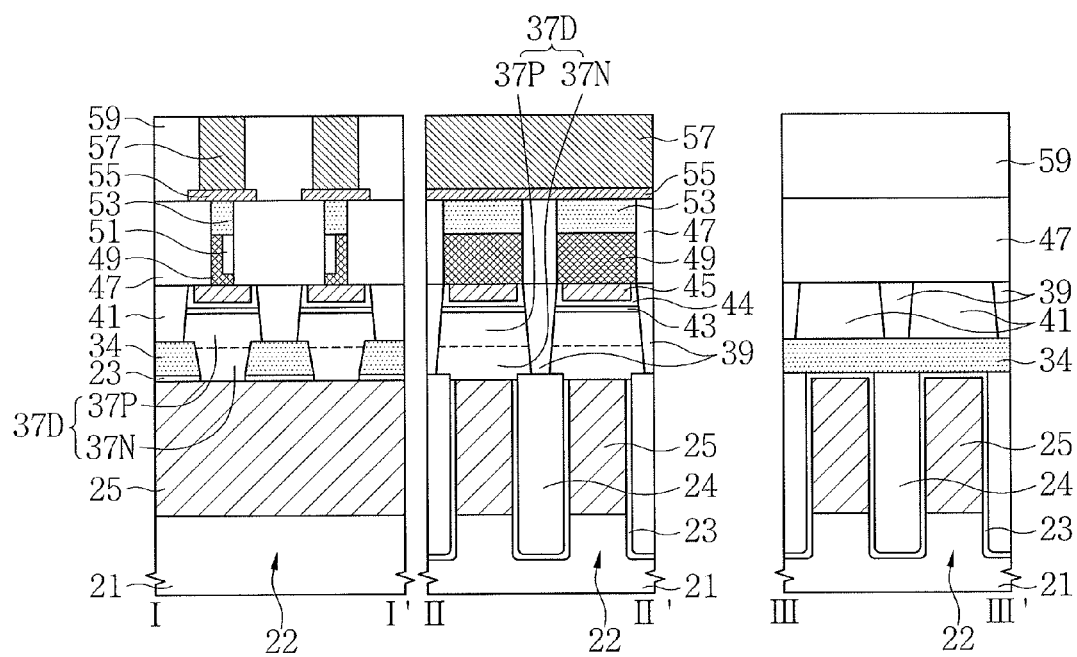
FIG. 9 illustrates views along section lines I-I', II-II', and III-III' in FIG. 3.
Figure 10:
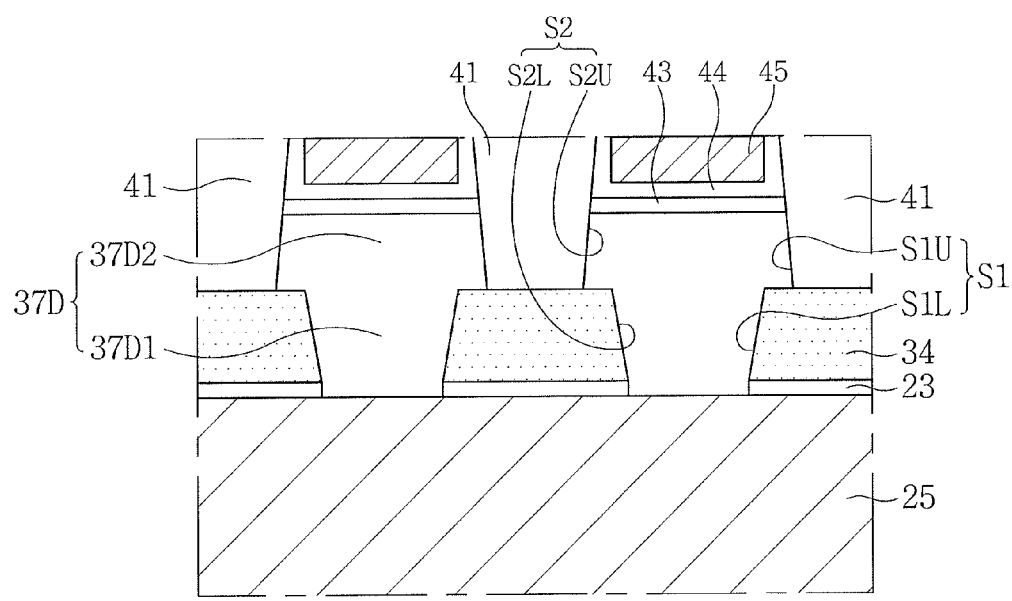
FIGS. 10 and 11 illustrate partially enlarged views of FIG. 9.
Figure 11:
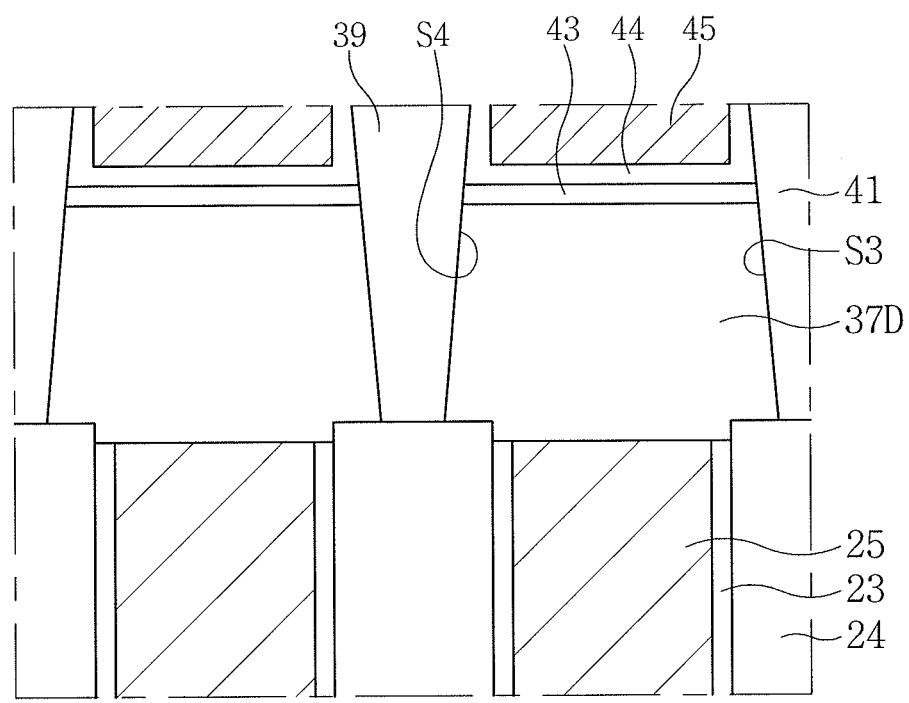

FIG. 7 illustrates another embodiment of a non-volatile memory device, and FIG. 8 illustrates an exploded perspective view for improved understanding of FIG. 7. In addition, FIG. 9 illustrates cross-sectional views taken along lines I-I', II-II', and III-III' of FIG. 7, for describing a non-volatile memory device in accordance with embodiments of the inventive concept. FIGS. 10 and 11 illustrate partially enlarged view showing a part of FIG. 9 in detail.

Referring to FIGS. 7 and 8, an active region 22 may be defined on a substrate 21. A word-line 25 may be formed on the active region 22. A pair of first insulating patterns 34 may be formed across the word-line 25. A first insulating layer 23 may be interposed between the word-line 25 and the first insulating patterns 34. A diode 37D in contact with the word-line 25 may be formed between the first insulating patterns 34. A metal silicide pattern 43 may be formed on the diode 37D. A barrier metal pattern 44 and a conductive pattern 45 may be sequentially formed on the metal silicide pattern 43. A data storage element 49, 51, and 53 may be formed on the conductive pattern 45. An upper electrode 55 and a bit-line 57 may be formed on the data storage element 49, 51, and 53.

Each of the first insulating patterns 34 may be a trapezoidal shape in which an upper horizontal width is smaller than a lower horizontal width. The diode 37D may include a lower part 37D1 having an inverted trapezoidal shape, and an upper part 37D2 having a trapezoidal shape. The lower part 37D1 may be confined between the first insulating patterns 34. The upper part 37D2 may be formed at a higher level than the first insulating patterns 34. The horizontal width of the upper part 37D2 may be greater than that of the lower part 37D1. A part of the upper part 37D2 may be in contact with upper surfaces of the first insulating patterns 34. Parts of the first insulating patterns 34 may overlap with the upper part 37D2.

Referring to FIGS. 9 to 11, active regions 22 and word-lines 25 bounded by a first insulating layer 23 and second insulating layer 24 may be formed on a substrate 21. First insulating patterns 34 may be arranged in parallel and formed across and over the word-lines 25. The first insulating layer 23 may be retained between the word-lines 25 and the first insulating patterns 34. Diodes 37D in contact with the word-lines 25 may be formed between the first insulating patterns 34. Metal silicide patterns 43 may be formed on the diodes 37D. Barrier metal patterns 44 and conductive patterns 45 may be sequentially formed on the metal silicide patterns 43. Second insulating patterns 39 in parallel may be formed across the first insulating patterns 34. Third insulating patterns 41 may be formed on the first insulating patterns 34. The third insulating patterns 41 may be formed between the second insulating patterns 39. Side surfaces of the diodes 37D may be in contact with the first insulating patterns 34, the second insulating patterns 39, and the third insulating patterns 41. The side surfaces of the diodes 37D may be bounded by the first insulating patterns 34, the second insulating patterns 39, and the third insulating patterns 41.

A molding layer 47 may be formed on the second insulating patterns 39 and the third insulating patterns 41. Data storage elements 49, 51, and 53 may be formed to pass through the molding layer 47. An upper insulating layer 59 may be formed on the molding layer 47. Upper electrodes 55 and bit-lines 57 connected to the data storage elements 49, 51, and 53 may be formed in the upper insulating layer 59.

Each of the first insulating patterns 34 may have a trapezoidal shape in which an upper horizontal width is smaller than a lower horizontal width. Each of the second insulating patterns 39 may have an inverted trapezoidal shape in which an upper horizontal width is greater than a lower horizontal width. Side surfaces of the third insulating patterns 41 may have different slopes from those of the first insulating patterns 34. Each of the diodes 37D may include a lower part 37D1 having an inverted trapezoidal shape, and an upper part 37D2 having a trapezoidal shape.

Each of the diodes 37D may include a first side surface S1, a second side surface S2 facing the first side surface S1, a third side surface S3 disposed between the first side surface S1 and the second side surface S2, and a fourth side surface S4 facing the third side surface S3. The first side surface S1 may include a first lower side surface S1L and a first upper side surface S1U. The second side surface S2 may include a second lower side surface S2L and a second upper side surface S2U. The first lower side surface S1L and the second lower side surface S2L may be defined in the lower part 37D1, and the first upper side surface S1U and the second upper side surface S2U may be defined in the upper part 37D2.

The first side surface S1 and the second side surface S2 may be aligned on the word-lines 25, and the third side surface S3 and the fourth side surface S4 may be aligned on the second insulating layer 24. The first lower side surface S1L and the second lower side surface S2L may be in contact with the first insulating patterns 34, and the first upper side surface S1U and the second upper side surface S2U may be in contact with the third insulating patterns 41. The third side surface S3 and the fourth side surface S4 may be in contact with the second insulating patterns 39.

The first side surface S1 and the second side surface S2 may have different profiles from the third side surface S3 and the fourth side surface S4. For example, the first upper side surface S1U may have a similar slope to the third side surface S3, and the first lower side surface S1L may have a different slope from the first upper side surface S1U. The first lower side surface S1L and the first upper side surface S1U may be askew or offset relative to each other. The second lower side surface S2L and the second upper side surface S2U may be askew or offset relative to each other.

Figure 12:
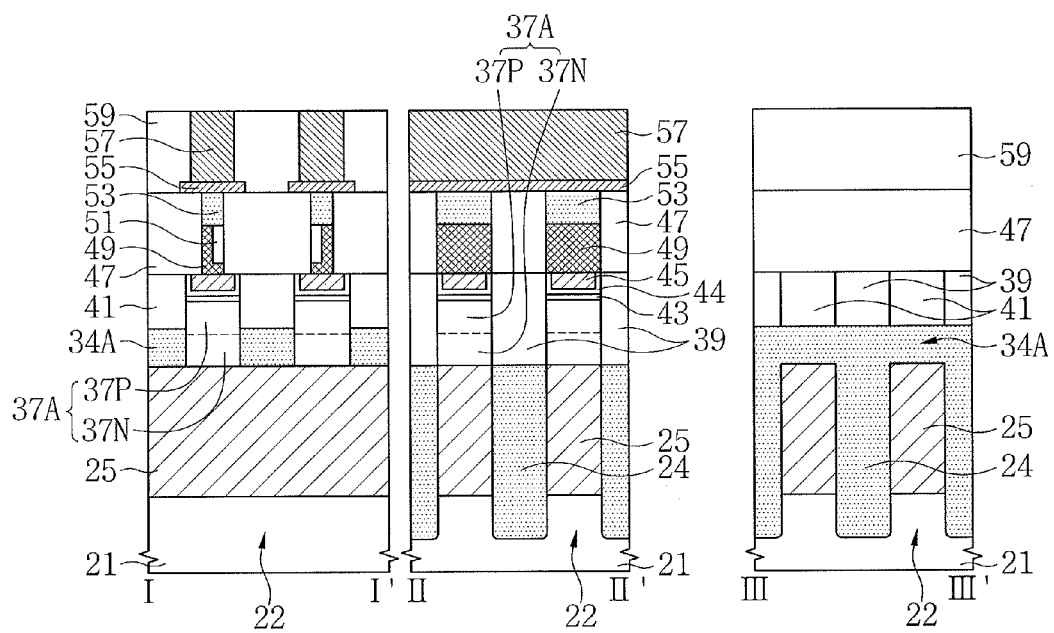
FIGS. 12 to 15 illustrate views along section lines I-I', II-II', and III-III' in FIG. 3.

FIGS. 12 to 15 illustrate cross-sectional views taken along lines I-I', II-II', and III-III' of FIG. 3 in accordance with another embodiment. Referring to FIGS. 3 and 12, active regions 22 in parallel may be defined on a substrate 21. Word-lines 25 may be formed on the active regions 22. The active regions 22 and the word-lines 25 may be bounded by the second insulating layer 24.

First insulating patterns 34A in parallel may be formed across over the word-lines 25. Diodes 37A in contact with the word-lines 25 may be formed between the first insulating patterns 34A. Metal silicide patterns 43 may be formed on the diodes 37A. Barrier metal patterns 44 and conductive patterns 45 may be sequentially formed on the metal silicide patterns 43.

Second insulating patterns 39 in parallel may be formed across the first insulating patterns 34A.

Third insulating patterns 41 may be formed on the first insulating patterns 34A. The third insulating patterns 41 may be formed between the second insulating patterns 39. A molding layer 47 may be formed on the second insulating patterns 39 and the third insulating patterns 41. Data storage elements 49, 51, and 53 may be formed to pass through the molding layer 47. An upper insulating layer 59 may be formed on the molding layer 47. Upper electrodes 55 and bit-lines 57 connected to the data storage elements 49, 51, and 53 may be formed in the upper insulating layer 59.

The first insulating patterns 34A may be the same material layer as the second insulating layer 24. The first insulating patterns 34A may be unitary with the second insulating layer 24. The first insulating patterns 34A may be continuous with the second insulating layer 24.

Figure 13:
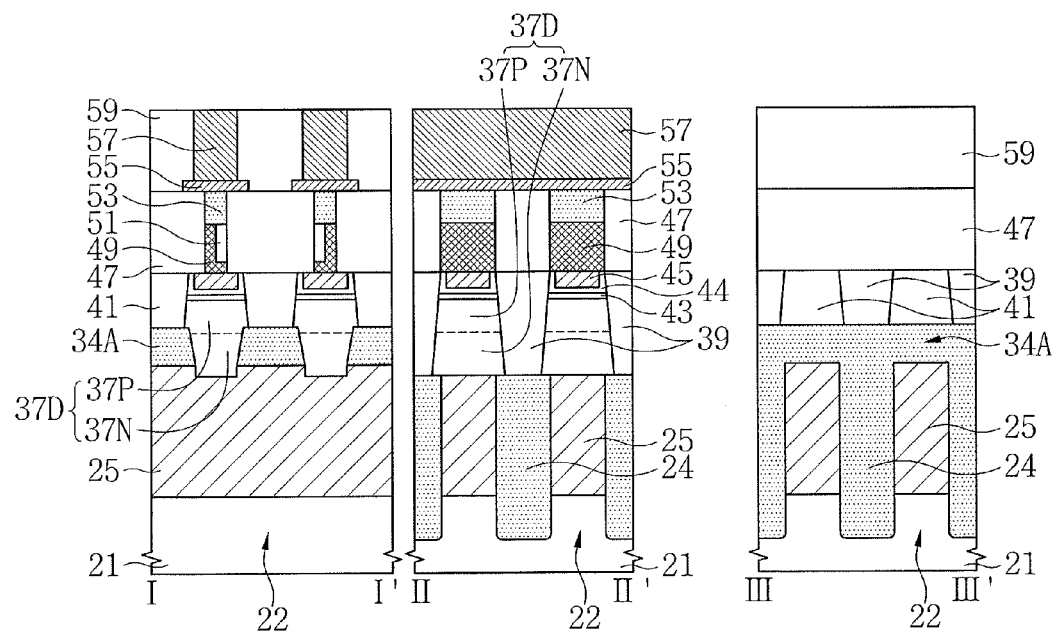

Referring to FIGS. 3 and 13, each of the first insulating patterns 34A may have a trapezoidal shape in which an upper horizontal width is smaller than a lower horizontal width. Each of the second insulating patterns 39 may have an inverted trapezoidal shape in which an upper horizontal width is greater than a lower horizontal width. Side surfaces of the diodes 37D may have different profiles from each other. Upper surfaces of the word-lines 25 may be recessed between the first insulating patterns 34A. Bottoms of the diodes 37D may be formed at a lower level than upper ends of the word-lines 25.

Figure 14:
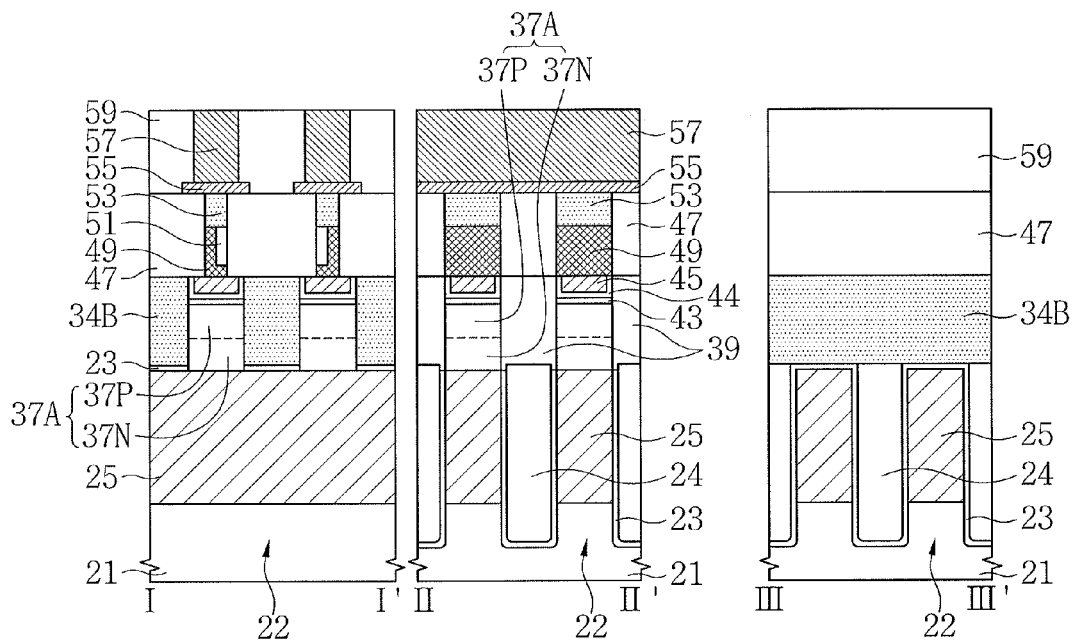

Referring to FIGS. 3 and 14, active regions 22, word-lines 25, a first insulating layer 23, a second insulating layer 24, and first insulating patterns 34B may be formed on a substrate 21. The first insulating patterns 34B may be in parallel. The first insulating layer 23 may be retained between the first insulating patterns 34B and the word-lines 25. Diodes 37A and second insulating patterns 39 may be formed between the first insulating patterns 34B.

Metal silicide patterns 43 may be formed on the diodes 37A. Barrier metal patterns 44 and conductive patterns 45 may be sequentially formed on the metal silicide patterns 43. A molding layer 47 may be formed on the first insulating patterns 34B and the second insulating patterns 39. Data storage elements 49, 51, and 53 passing through the molding layer 47 may be formed. An upper insulating layer 59 may be formed on the molding layer 47. Upper electrodes 55 and bit-lines 57 connected to the data storage elements 49, 51, and 53 may be formed in the upper insulating layer 59.

Figure 15:
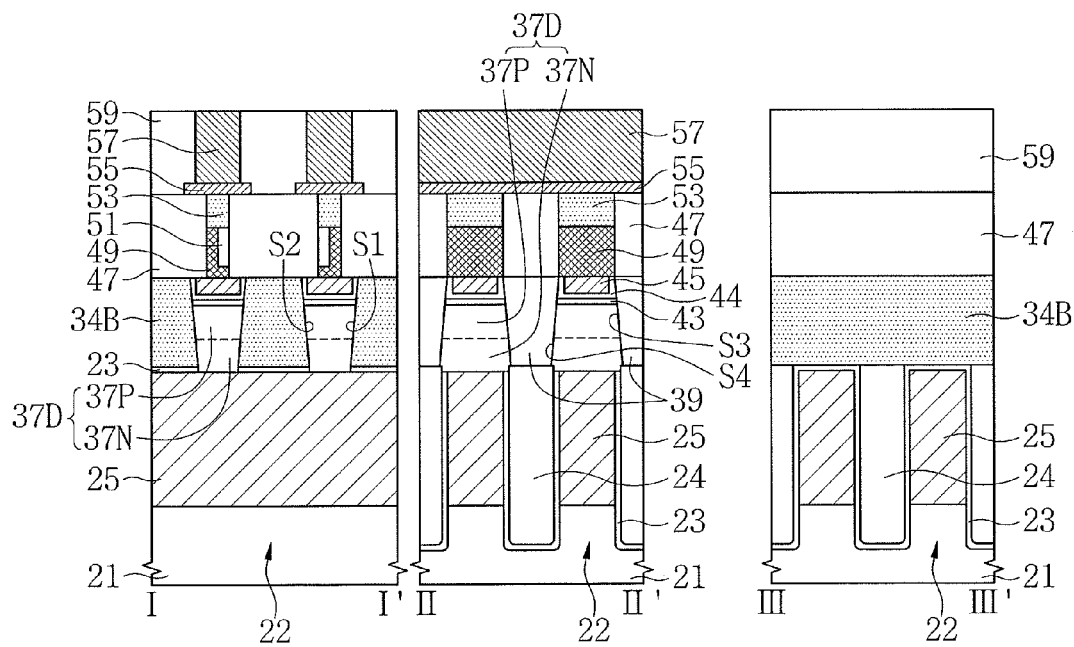

Referring to FIGS. 3 and 15, each of the first insulating patterns 34B may have a trapezoidal shape in which an upper horizontal width is smaller than a lower horizontal width. Each of the second insulating patterns 39 may have an inverted trapezoidal shape in which an upper horizontal width is greater than a lower horizontal width. Each of the diodes 37D may include a first side surface S1, a second side surface S2 facing the first side surface S1, a third side surface S3 disposed between the first side surface S1 and the second side surface S2, and a fourth side surface S4 facing the third side surface S3.

The first side surface S1 and the second side surface S2 may be aligned on the word-lines 25, and the third side surface S3 and the fourth side surface S4 may be aligned on the second insulating layer 24. The first side surface S1 and the second side surface S2 may be in contact with the first insulating patterns 34B, and the third side surface S3 and the fourth side surface S4 may be in contact with the second insulating patterns 39.

The first side surface S1 and the second side surface S2 may have different profiles from the third side surface S3 and the fourth side surface S4. For example, each of the diodes 37D may have an inverted trapezoidal shape when viewed in a first direction which includes the first side surface S1 and the second side surface S2. Each of the diodes 37D may have a trapezoidal shape when viewed in a second direction intersecting the first direction. Each of the diodes 37D may have a trapezoidal shape when viewed in the second direction which includes the third side surface S3 and the fourth side surface S4.

Figure 16:
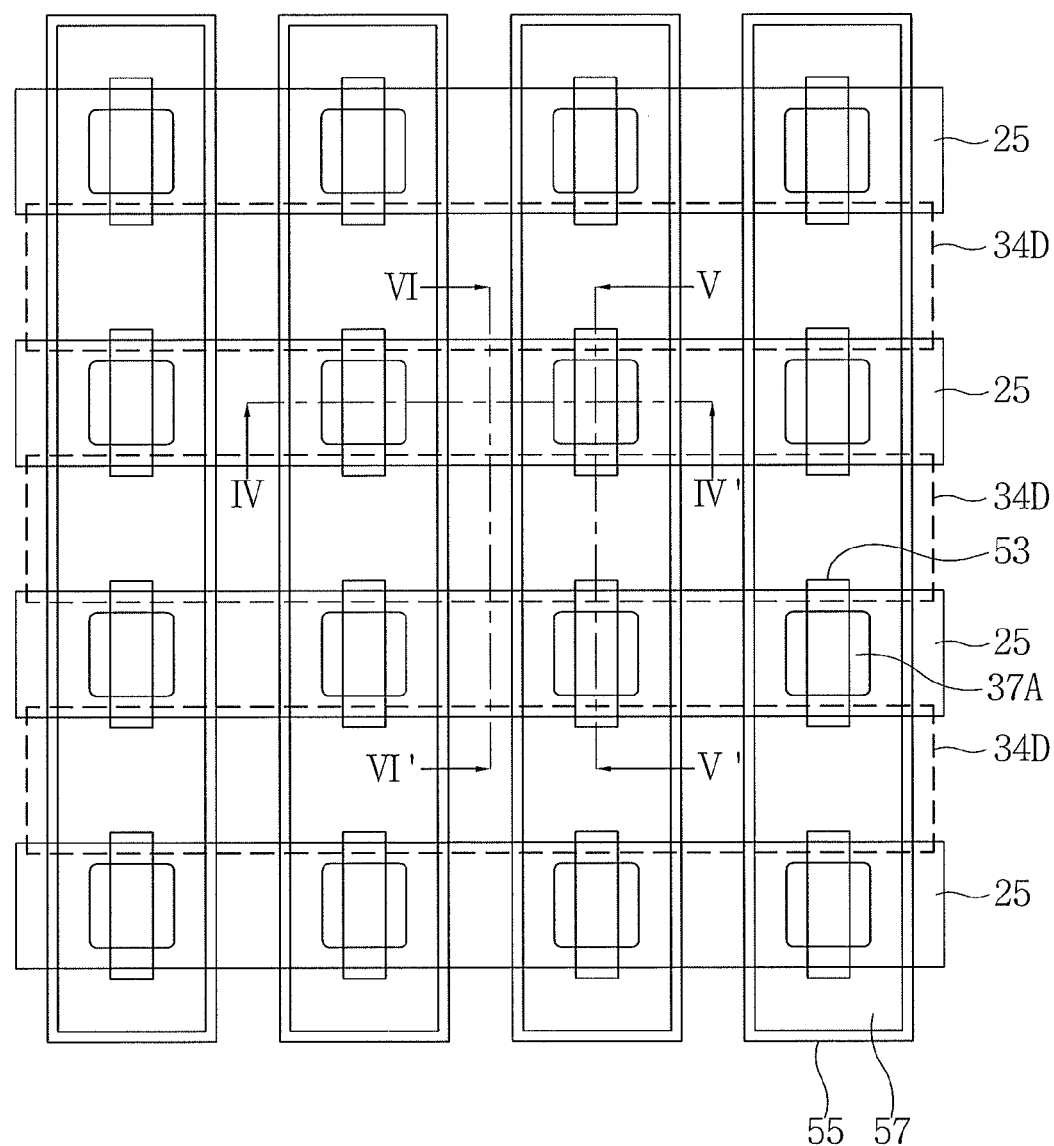
FIG. 16 illustrates another layout for a non-volatile memory device.
Figure 17:
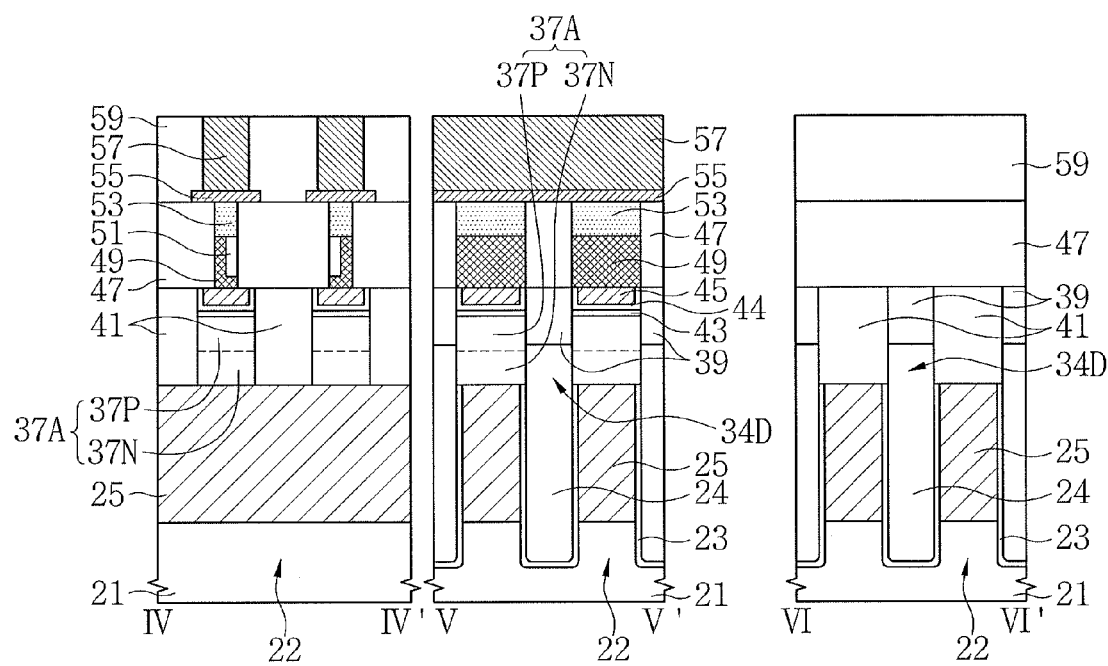
FIG. 17 illustrates views along section lines IV-IV', V-V', and VI-VI' in FIG. 16.

FIG. 16 illustrates another embodiment of a layout for a non-volatile memory device, and FIG. 17 illustrates cross-sectional views taken along lines IV-IV', V-V', and VI-VI' of FIG. 16.

Referring to FIG. 16, word-lines 25 may be aligned in parallel and formed in a cell array region of a non-volatile memory device. Upper electrodes 55 may be formed across and over the word-lines 25. Bit-lines 57 may be formed on the upper electrodes 55. The bit-lines 57 may be at right angles to the word-lines 25. Phase-change patterns 53 and diodes 37A may be formed at intersections of the word-lines 25 and the bit-lines 57. The diodes 37A may be formed between first insulating patterns 34D parallel to each other. The first insulating patterns 34D may be aligned between the word-lines 25.

Referring to FIGS. 16 and 17, active regions 22 and word-lines 25 may be formed on the substrate 21. The active regions 22 and the word-lines 25 may be bounded by a first insulating layer 23 and a second insulating layer 24. The second insulating layer 24 may protrude at a higher level than the word-lines 25. Portions of the second insulating layer 24 protruding at the higher level than the word-lines 25 may function as the first insulating patterns 34D. The first insulating patterns 34D may be in parallel. The first insulating patterns 34D may be aligned between the word-lines 25. Second insulating patterns 39 may be formed on the first insulating patterns 34D. Diodes 37A and third insulating patterns 41 in contact with the word-lines 25 may be formed between the first insulating patterns 34D. Each of the diodes 37A may be in contact with the first insulating patterns 34D, the second insulating patterns 39, and the third insulating patterns 41.

Metal silicide patterns 43 may be formed on the diodes 37A. Barrier metal patterns 44 and conductive patterns 45 may be sequentially formed on the metal silicide patterns 43. A molding layer 47 may be formed on the second insulating patterns 39 and the third insulating patterns 41. Data storage elements 49, 51, and 53 may be formed to pass through the molding layer 47. An upper insulating layer 59 may be formed on the molding layer 47. Upper electrodes 55 and bit-lines 57 connected to the data storage elements 49, 51, and 53 may be formed in the upper insulating layer 59.

FIGS. 18 to 22A, 22C, 22D, and FIGS. 23 to 28 illustrate cross-sectional views taken along section lines I-I', II-II', and III-III' of FIG. 3. FIG. 22B illustrates a perspective view for improved understanding of FIG. 22A, and FIG. 22E illustrates a perspective view for improved understanding of FIG. 22D. Layouts, cross-sectional views, and perspective views described in FIG. 3 and FIGS. 18 to 28 correspond to a cell array region of a phase-change memory device.

Figure 18:
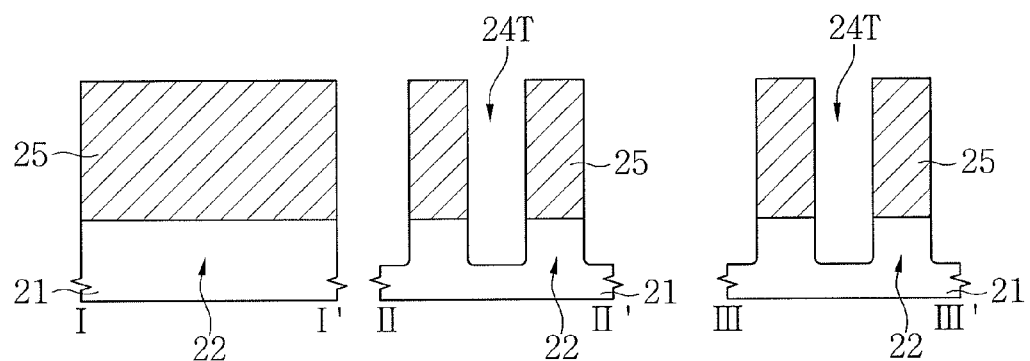

Referring to FIGS. 3 and 18, trenches 24T defining active regions 22 and word-lines 25 may be formed on a substrate 21. The substrate 21 may be a semiconductor substrate such as a single crystalline silicon wafer or a silicon on insulator (SOI) wafer. For example, the substrate 21 may be a silicon wafer containing p-type impurities. The active regions 22 may be defined by the trenches 24T in predetermined regions of the substrate 21. The active regions 22 may be a single crystalline silicon containing p-type impurities. The active regions 22 may be parallel to each other.

The word-lines 25 may be formed by injecting n-type impurities to the substrate 21. The word-lines 25 may be single crystalline silicon containing n-type impurities. The word-lines 25 may be formed on the active regions 22. Side surfaces of the word-lines 25 and active regions 22 may be vertically aligned. The word-lines 25 may be self-aligned on the active regions 22. Each of the word-lines 25 may have a vertical height greater than a horizontal width.

Figure 19:
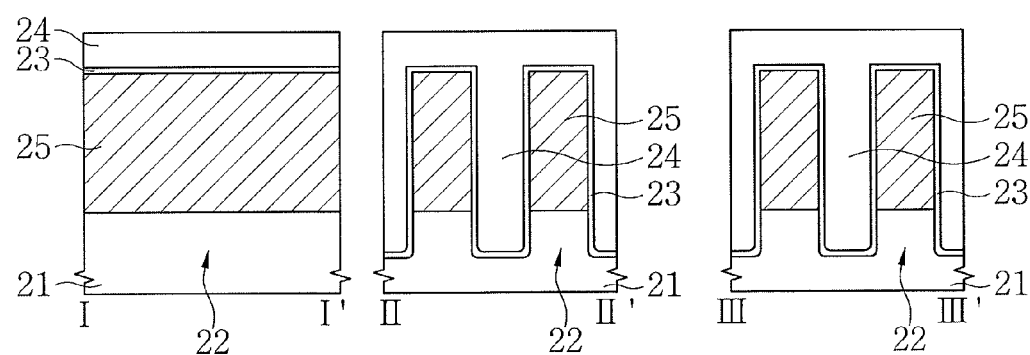

Referring to FIGS. 3 and 19, a first insulating layer 23 and second insulating layer 24 burying the trenches 24T and covering the substrate 21 may be sequentially formed. The first insulating layer 23 may conformally cover inner walls of the trenches 24T and upper surfaces of the word-lines 25. The second insulating layer 24 may fully fill the trenches 24T. Each of the first insulating layer 23 and the second insulating layer 24 may include silicon oxide, silicon nitride, silicon oxynitride, or a combination thereof. The first insulating layer 23 may include a material having an etch selectivity with respect to the second insulating layer 24. For example, the first insulating layer 23 may be silicon oxide, and the second insulating layer 24 may be silicon nitride.

Figure 20:
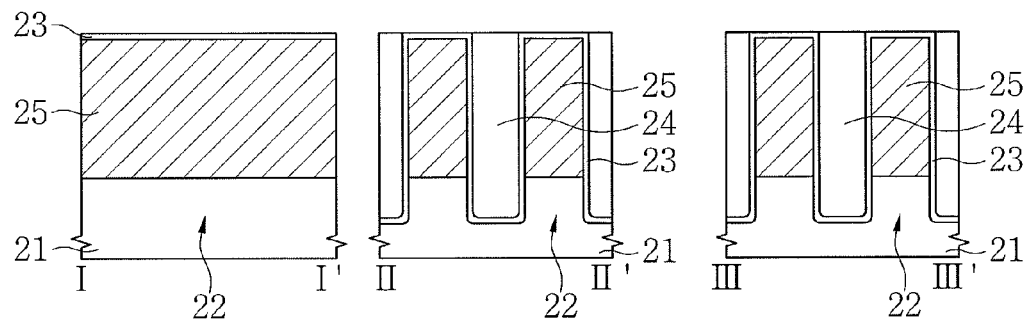

Referring to FIGS. 3 and 20, the second insulating layer 24 may be planarized to expose the first insulating layer 23. The planarization of the second insulating layer 24 may include a chemical mechanical polishing (CMP) process, an etchback process, or a combination thereof. The second insulating layer 24 may be retained in the trenches 24T.

Figure 21:
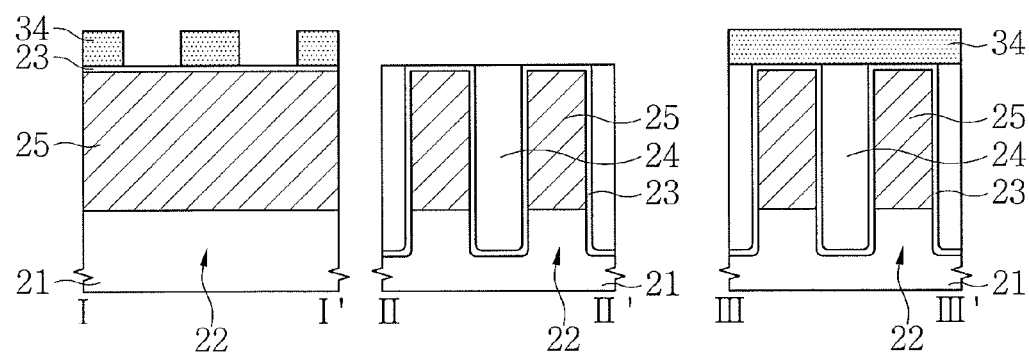
Figure 22A:
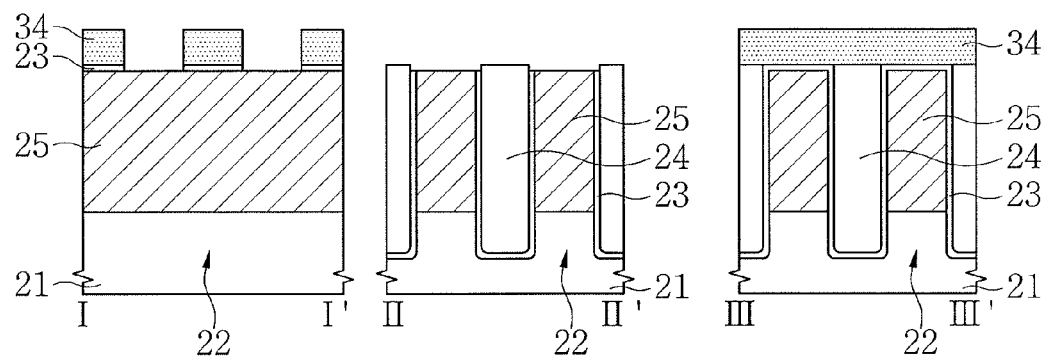
Figure 22B:
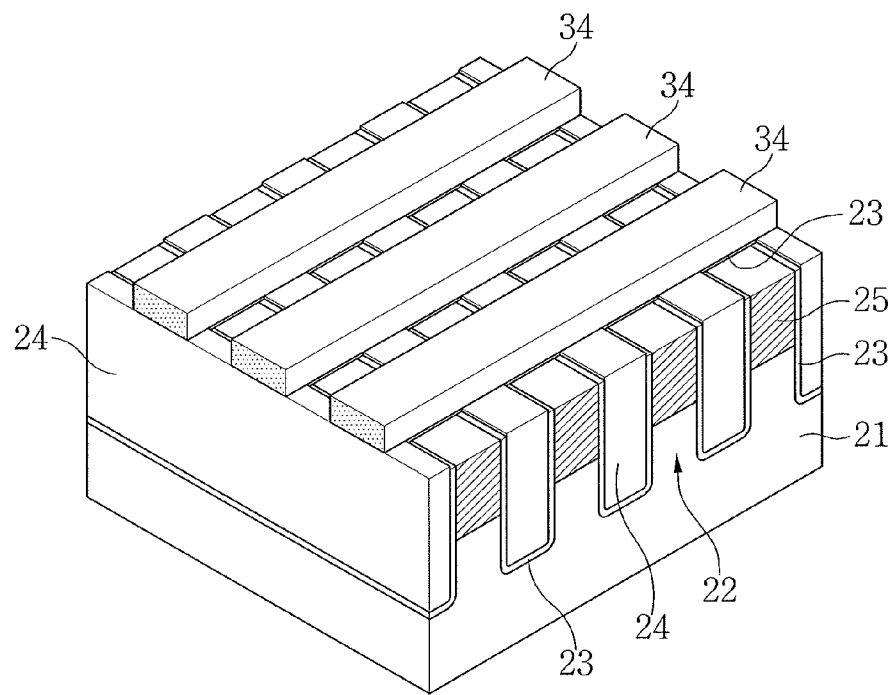
FIG. 22B illustrates a view for understanding of FIG. 22A.

Referring to FIGS. 3 and 21, first insulating patterns 34 may be formed on the first insulating layer 23 and the second insulating layer 24. The first insulating patterns 34 may be formed by a thin-film formation process and a patterning process. The first insulating patterns 34 may be parallel to each other. The first insulating patterns 34 may cross over the word-lines 25. The first insulating layer 23 and the second insulating layer 24 may be exposed between the first insulating patterns 34.

The first insulating patterns 34 may include silicon oxide, silicon nitride, silicon oxynitride, or a combination thereof. The first insulating patterns 34 may include a material having an etch selectivity with respect to the first insulating layer 23. For example, the first insulating layer 23 may be silicon oxide, and the first insulating patterns 34 may be silicon nitride.

Referring to FIGS. 3, 22A, and 22B, the first insulating layer 23 may be removed to expose the word-lines 25 between the first insulating patterns 34. The first insulating layer 23 may be retained between the first insulating patterns 34 and the word-lines 25. Each of the first insulating patterns 34 may have a quadrangular shape in which an upper horizontal width and a lower horizontal width are substantially the same.

Figure 22C:
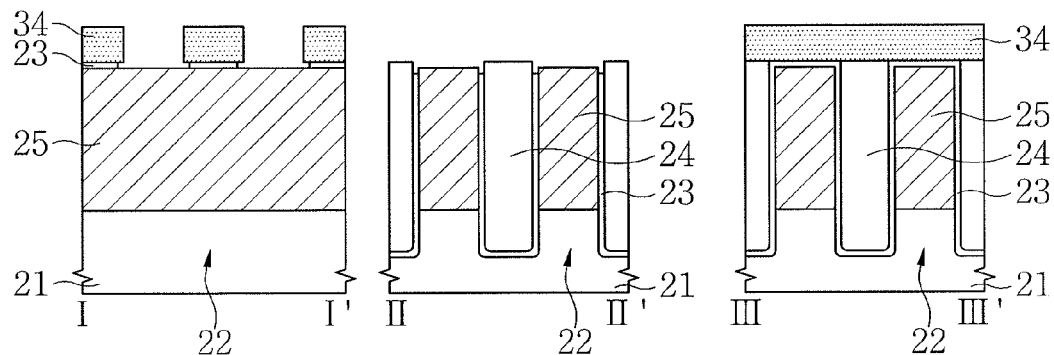

Referring to FIG. 22C, the removal of the first insulating layer 23 may include an over-etch process. Under-cuts may be formed below the first insulating patterns 34. Upper and side surfaces of the word-lines 25 may be partially exposed.

Figure 22D:
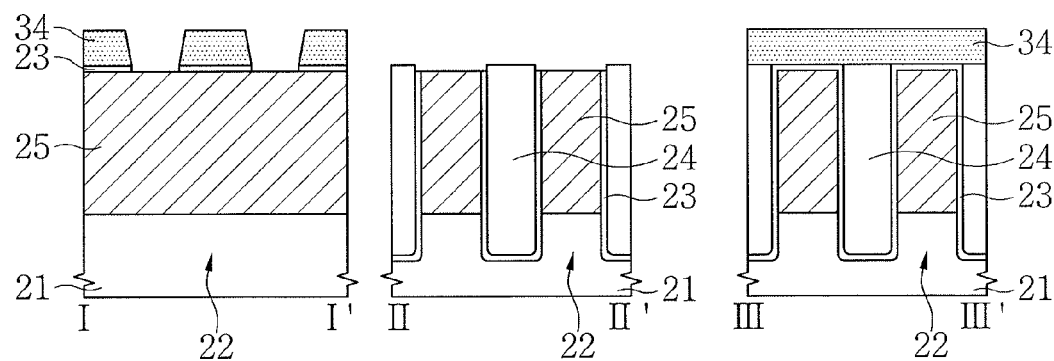
Figure 22E:
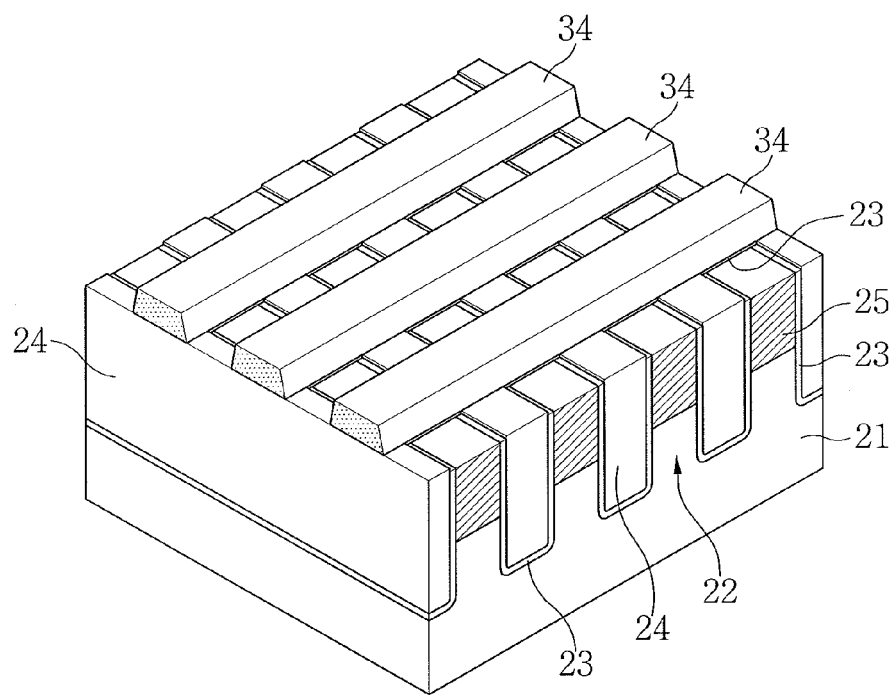
FIG. 22E illustrates a view for understanding of FIG. 22D.

Referring to FIGS. 22D and 22E, the formation of the first insulating patterns 34 may include an anisotropic etch process. Each of the first insulating patterns 34 may have a trapezoidal shape in which an upper horizontal width is smaller than a lower horizontal width.

Figure 23:
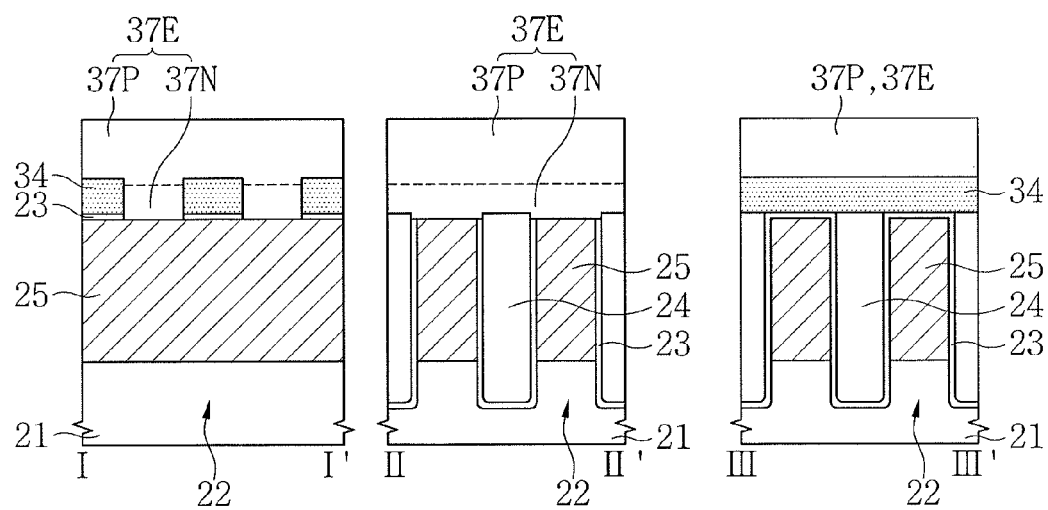

Referring to FIGS. 3 and 23, a diode layer 37E may be formed between the first insulating patterns 34 and covering the first insulating patterns 34. The diode layer 37E may be in contact with the word-lines 25. The diode layer 37E may be a semiconductor layer formed, for example, by an SEG process or a solid-phase epitaxial growth process. The diode layer 37E may be single crystalline silicon. The diode layer 37E may contact side and upper surfaces of the first insulating patterns 34.

The diode layer 37E may include a first region 37N and a second region 37P. The second region 37P may be formed on the first region 37N. The first region 37N may include n-type impurities. The concentration of n-type impurities in the first region 37N may be lower than that in the word-lines 25. The second region 37P may include p-type impurities. For example, the second region 37P may be single crystalline silicon containing p-type impurities, and the first region 37N may be single crystalline silicon containing n-type impurities. The upper end of the first region 37N may be formed at a lower level than the upper surfaces of the first insulating patterns 34.

In other embodiments, the upper end of the first region 37N may be formed at a higher level than the upper surfaces of the first insulating patterns 34. The first region 37N may be omitted. When the first region 37N is omitted, the second region 37P may be in contact with the word-lines 25.

Figure 24A:
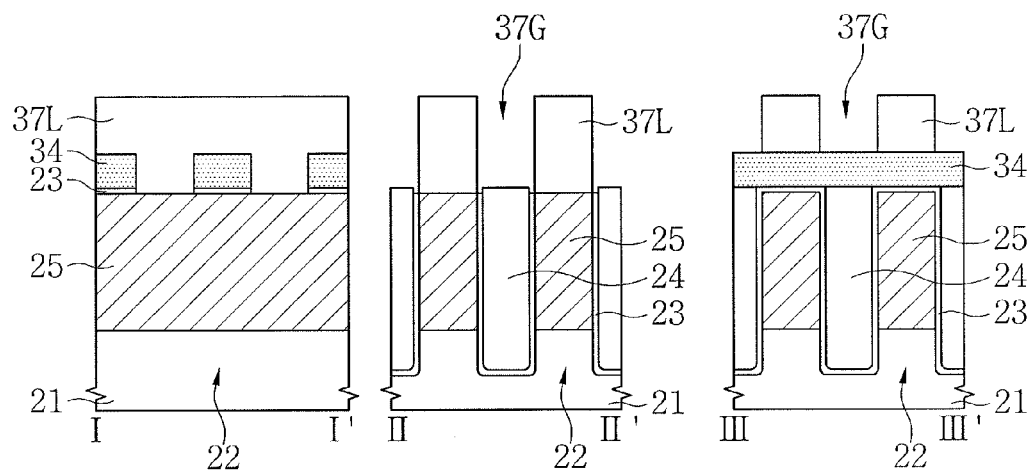

Referring to FIGS. 3 and 24A, diode lines 37L may be formed by patterning the diode layer 37E. Grooves 37G may be formed between the diode lines 37L. The diode lines 37L may be parallel to each other. The diode lines 37L may cross the first insulating patterns 34. The diode lines 37L may be parallel to the word-lines 25. The first insulating patterns 34 and the second insulating layer 24 may be exposed on bottoms of the grooves 37G.

Figure 24B:
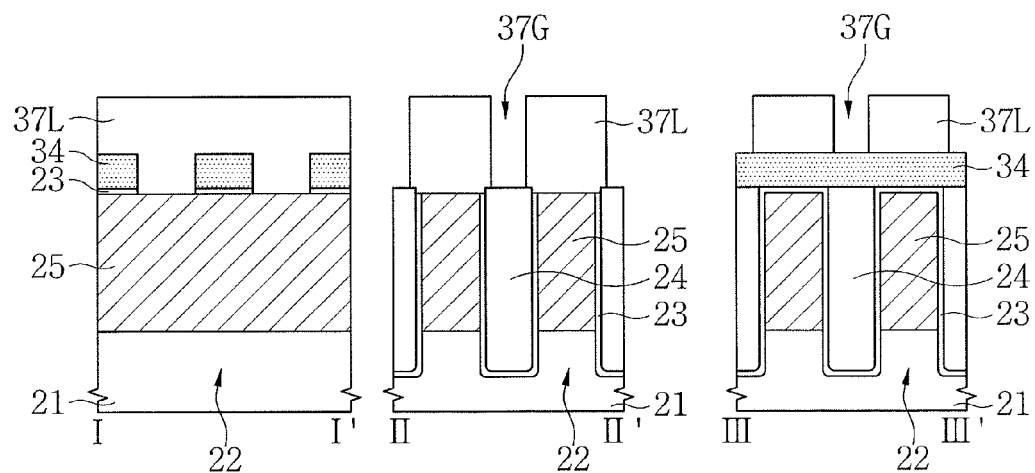

Referring to FIG. 24B, the formation of the diode lines 37L may include an anisotropic etch process. The diode lines 37L may have a different horizontal width from the word-lines 25. The diode lines 37L may have a greater width than the word-lines 25.

Figure 24C:
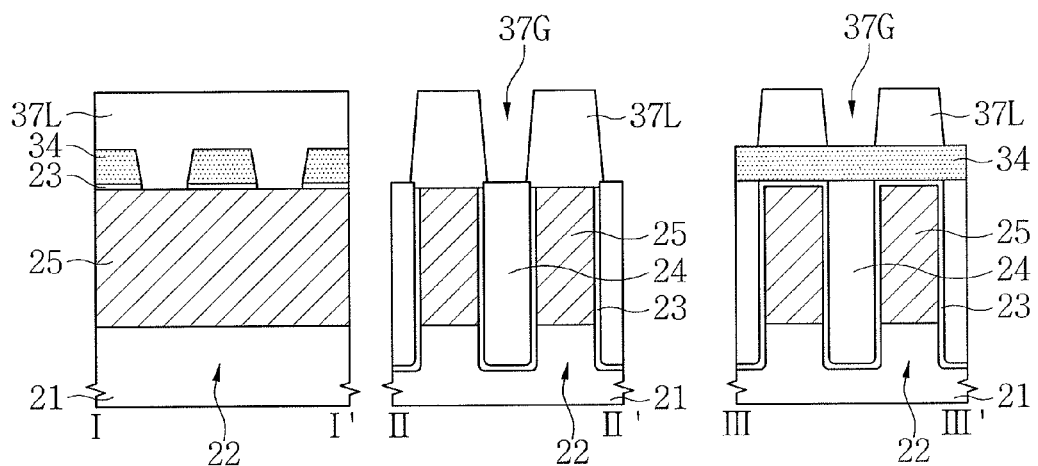

Referring to FIG. 24C, each of the diode lines 37L may have a trapezoidal shape in which an upper horizontal width is smaller than a lower horizontal width. Lower surfaces of the diode lines 37L may have a greater width than the word-lines 25. Each of the grooves 37G may have an inverted trapezoidal shape in which an upper horizontal width is greater than a lower horizontal width.

Figure 25:
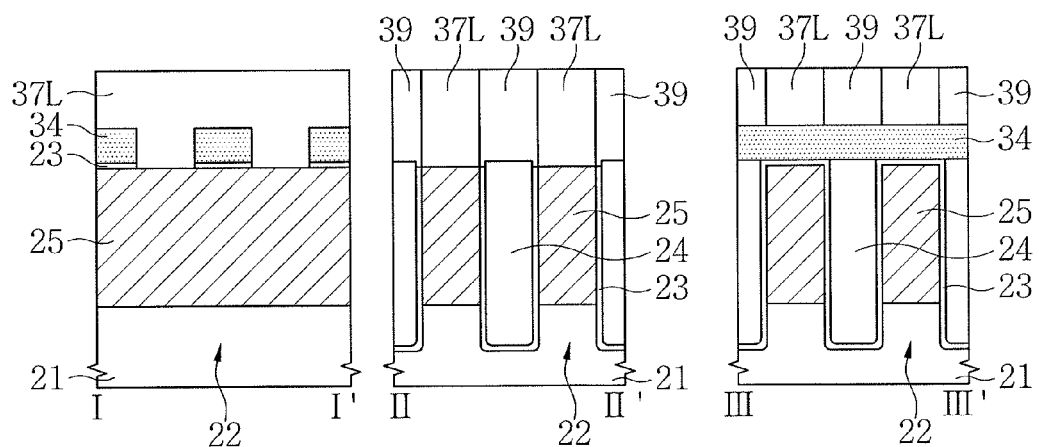

Referring to FIGS. 3 and 25, second insulating patterns 39 filling the grooves 37G may be formed. The formation of the second insulating patterns 39 may include a thin-film formation process and a planarization process. The planarization process may include a CMP process, an etchback process, or a combination thereof. The second insulating patterns 39 may include silicon oxide, silicon nitride, silicon oxynitride, or a combination thereof. Upper ends of the second insulating patterns 39 and diode lines 37L may be exposed substantially on the same plane.

In some embodiments, each of the second insulating patterns 39 may have an inverted trapezoidal shape in which an upper horizontal width is greater than a lower horizontal width.

Figure 26A:
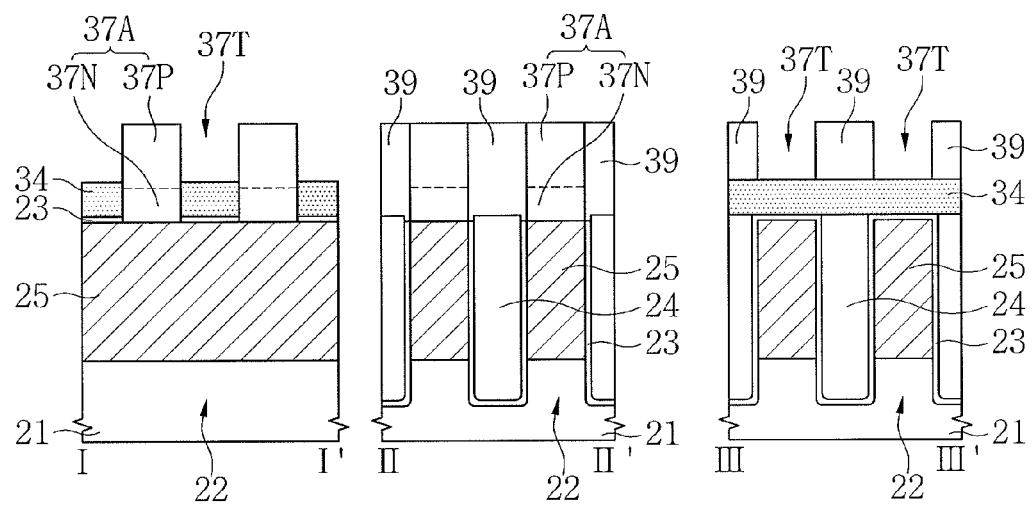

Referring to FIGS. 3 and 26A, diodes 37A may be formed by patterning the diode lines 37L. Upper trenches 37T may be formed between the diodes 37A. The diodes 37A may be in contact with the word-lines 25. In one embodiment, the vertical height of the diodes 37A may be 1.2 to 5 times those of the first insulating patterns 34. Each of the diodes 37A may include a first region 37N and a second region 37P.

Figure 26B:
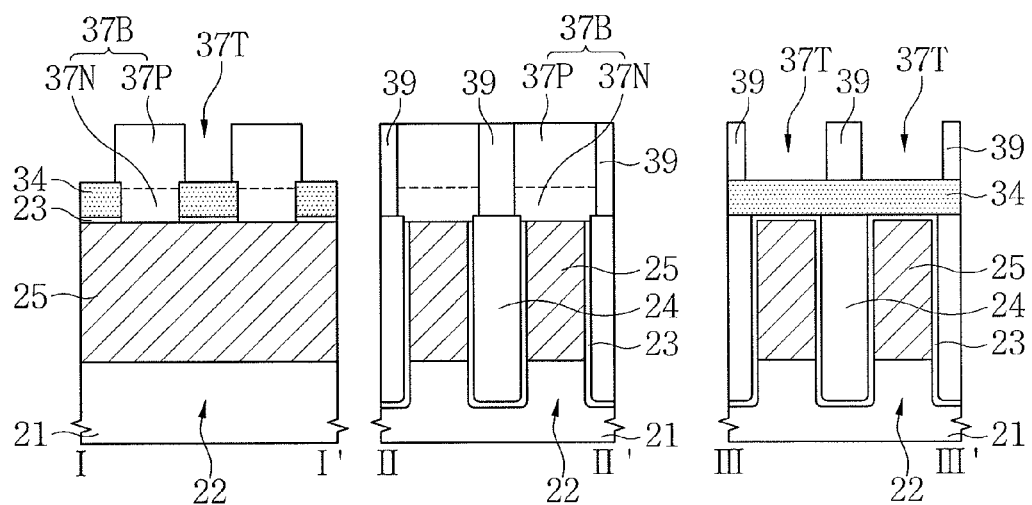

Referring to FIG. 26B, each of the diodes 37B may have a greater horizontal width than the word-lines 25. Some side surfaces of the diodes 37B may have upper and lower parts which are askew or offset relative to each other.

Figure 26C:
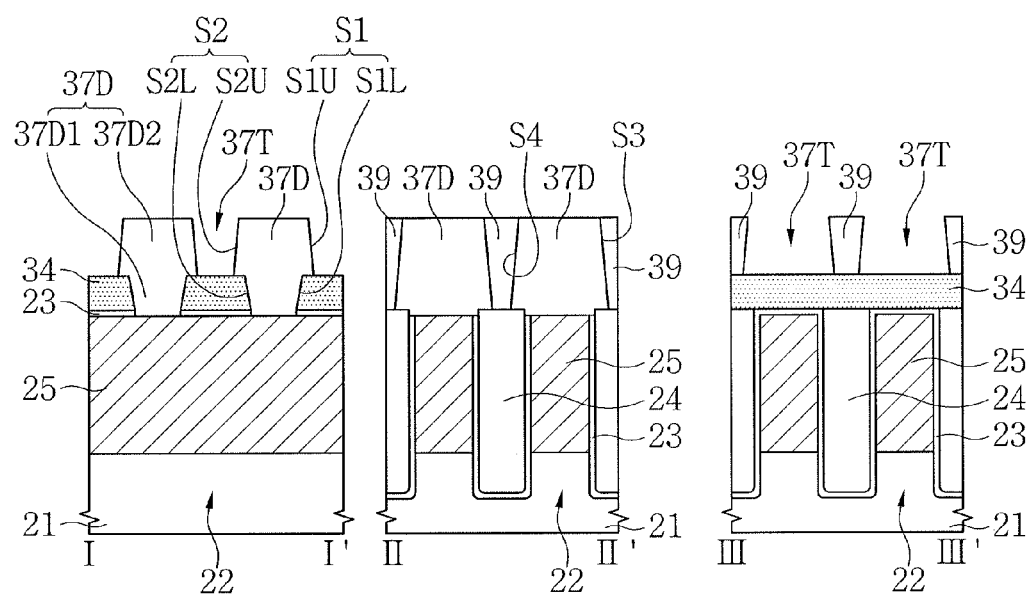
Figure 27A:
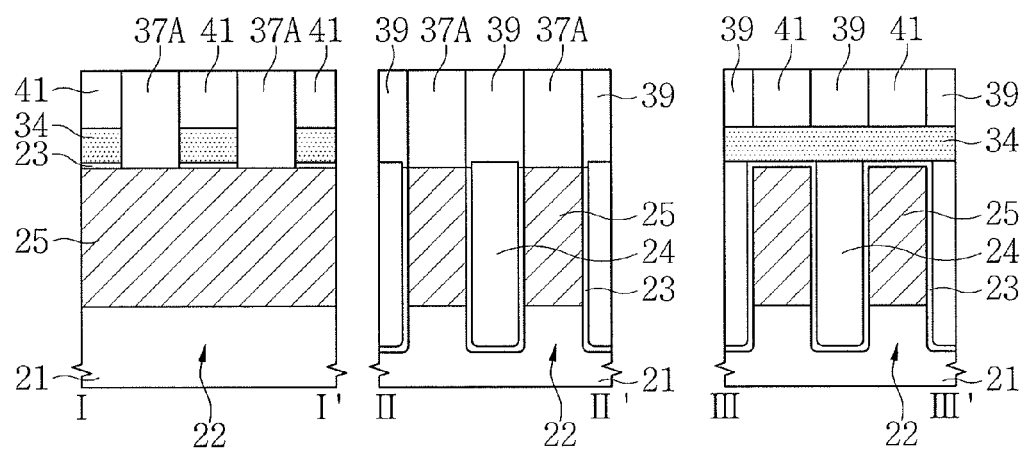
Figure 27B:
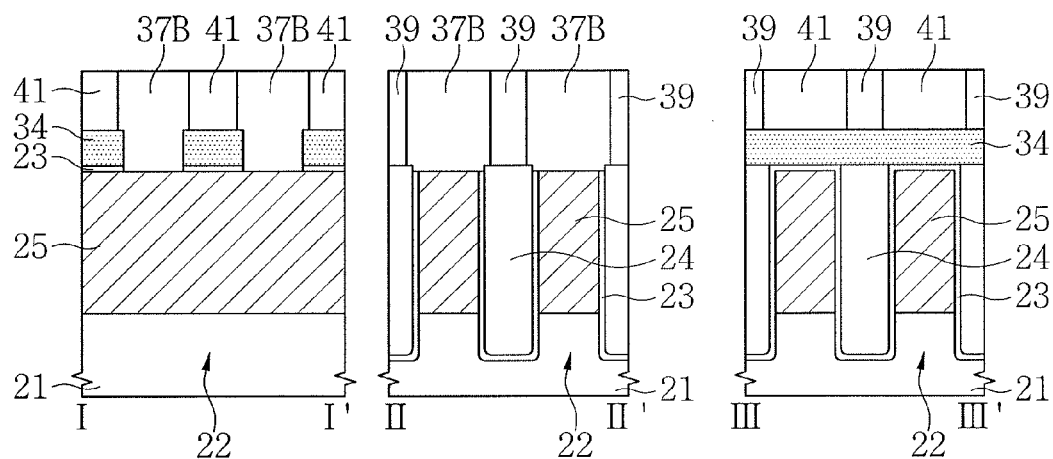
Figure 27C:
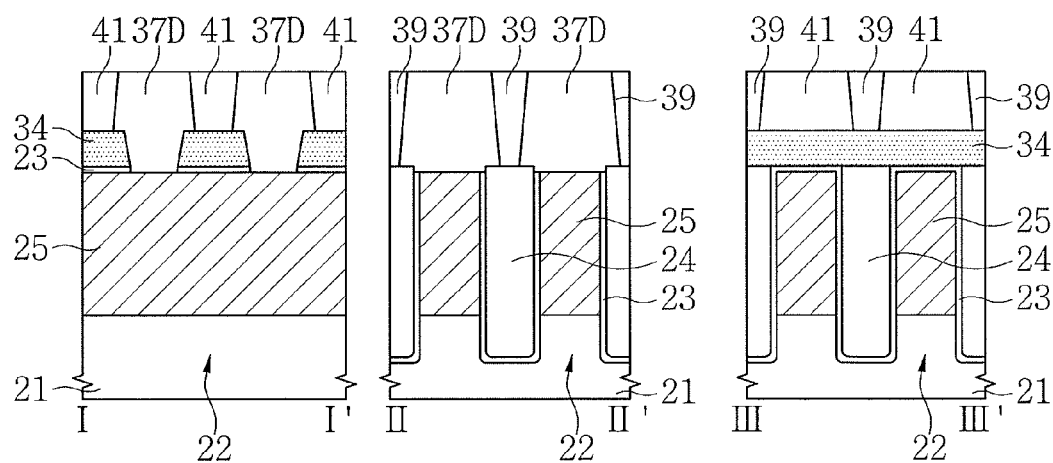

Referring to FIG. 26C, some side surfaces of the diodes 37D may have an upper part and a lower part which are askew to each other. Each of the diodes 37D may have a lower part 37D1 with an inverted trapezoidal shape, and an upper part 37D2 with a trapezoidal shape. The lower part 37D1 may be confined between the first insulating patterns 34. The upper part 37D2 may be formed at a higher level than the first insulating patterns 34. The upper part 37D2 may have a greater horizontal width than the lower part 37D1.

Each of the diodes 37D may include a first side surface S1, a second side surface S2 facing the first side surface S1, a third side surface S3 disposed between the first side surface S1 and the second side surface S2, and a fourth side surface S4 facing the third side surface S3. The first side surface S1 may include a first lower side surface S1L and a first upper side surface S1U, and the second side surface S2 may include a second lower side surface S2L and a second upper side surface S2U. The first lower side surface S1L and the second lower side surface S2L may be defined in the lower part 37D1, and the first upper side surface S1U and the second upper side surface S2U may be defined in the upper part 37D2. The first side surface S1 and the second side surface S2 may have different profiles from the third side surface S3 and the fourth side surface S4. For example, the first upper side surface S1U may have a similar slope to the third side surface S3, and the first lower side surface S1L may have a different slope from the first upper side surface S1U.

Referring to FIGS. 3, 27A, 27B, and 27C, third insulating patterns 41 filling the upper trenches 37T may be formed. The formation of the third insulating patterns 41 may include a thin-film formation process and a planarization process. The planarization process may include a CMP process, an etch-back process, or a combination thereof. The third insulating patterns 41 may include silicon oxide, silicon nitride, silicon oxynitride, or a combination thereof. Upper ends of the second insulating patterns 39, third insulating patterns 41, and diodes 37A, 37B, and 37D may be exposed substantially on the same plane.

Figure 28:
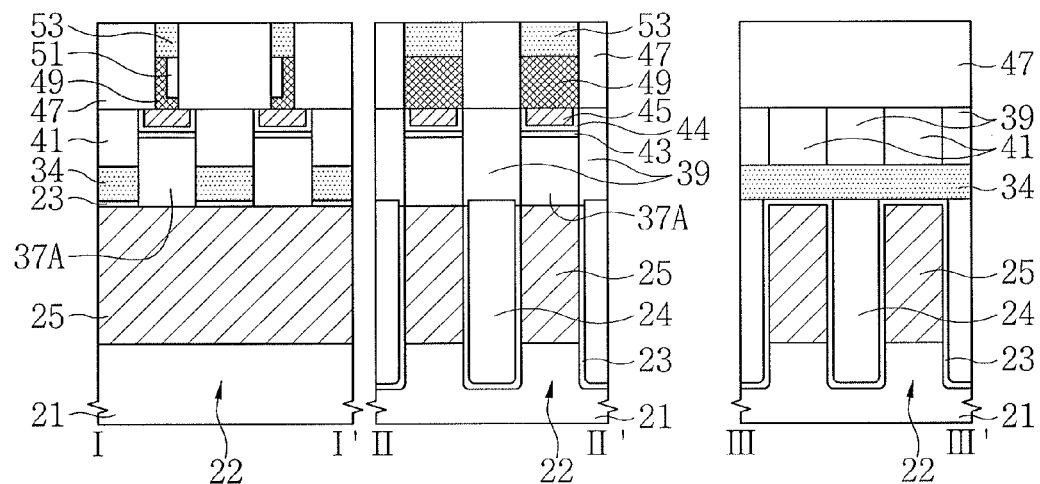

Referring to FIGS. 3, 4, and 28, metal silicide patterns 43 may be formed on the diodes 37A. Barrier metal patterns 44 and conductive patterns 45 may be sequentially formed on the metal silicide patterns 43. The metal silicide patterns 43 may include CoSi, NiSi, WSi, TiSi, or TaSi. The barrier metal patterns 44 may include Ti, TiN, TiAlN, TiCN, TiSiN, TiON, Ta, TaN, TaAlN, TaCN, TaSiN, C, CN, CoSi, CoSiN, WN, WSi, WSiN, or a combination thereof. The conductive patterns 45 may include Ti, TiN, TiAlN, TiCN, TiSiN, TiON, Ta, TaN, TaAlN, TaCN, TaSiN, C, CN, CoSi, CoSiN, W, WN, WSi, WSiN, Ni, or a combination thereof. For example, the barrier metal patterns 44 may be a Ti/TiN layer, and the conductive patterns 45 may be a W layer.

A molding layer 47 may be formed on the second insulating patterns 39 and the third insulating patterns 41. Data storage elements 49, 51, and 53 passing through the molding layer 47 may be formed. Each of the data storage elements 49, 51, and 53 may include an electrode structure 49 and 51, and a phase-change pattern 53 disposed on the electrode structure 49 and 51. The electrode structure 49 and 51 may include a lower electrode 49 and a resistive pattern 51.

The molding layer 47 may include silicon oxide, silicon nitride, silicon oxynitride, or a combination thereof. The lower electrode 49 may include Ti, TiN, TiAlN, TiCN, TiSiN, TiON, Ta, TaN, TaAlN, TaCN, TaSiN, C, CN, CoSi, CoSiN, W, WN, WSi, WSiN, Ni, or a combination thereof. The resistive pattern 51 may include a different material from the lower electrode 49. The resistive pattern 51 may include a material having a higher resistivity than the lower electrode 49. The resistive pattern 51 may include an insulating material. The resistive pattern 51 may include polysilicon, silicon oxide, silicon nitride, silicon oxynitride, or a combination thereof.

The phase-change pattern 53 may include GeSbTe, GeTeAs, SnTeSn, GeTe, SbTe, SeTeSn, GeTeSe, SbSeBi, GeBiTe, GeTeTi, InSe, GaTeSe, or InSbTe. The phase-change pattern 53 may be a material layer including one selected from the group consisting of a GeSbTe layer, a GeTeAs layer, a SnTeSn layer, a GeTe layer, a SbTe layer, a SeTeSn layer, a GeTeSe layer, a SbSeBi layer, a GeBiTe layer, a GeTeTi layer, an InSe layer, a GaTeSe layer, and an InSbTe layer containing one selected from the group consisting of C, N, Si, and O. In one embodiment, the phase-change pattern 53 may be formed by stacking different materials. In other embodiments, the phase-change pattern 53 may be substituted with a polymer plug, a nanoparticle plug, or a resistance-change plug. For example, the phase-change pattern 53 may be substituted with a $SrTiO_3$ layer.

In other embodiments, some or all of the data storage elements 49, 51, and 53 may be substituted with a magnetic tunnel junction (MTJ), a resistive memory cell, a polymer memory cell, a ferroelectric memory cell, or a combination thereof.

An upper insulating layer 59 may be formed on the molding layer 47. Upper electrodes 55 in contact with the phase-change patterns 53 may be formed in the upper insulating layer 59. Bit-lines 57 may be formed on the upper electrodes 55. The upper insulating layer 59 may include silicon oxide, silicon nitride, silicon oxynitride, or a combination thereof. The upper electrodes 55 may include W, WN, WSi, WSiN, Ti, TiN, TiAlN, TiCN, TiSiN, TiON, Ta, TaN, TaAlN, TaCN, TaSiN, C, CN, CoSi, CoSiN, Ni, or a combination thereof. The bit-lines 57 may include W, WN, WSi, WSiN, Ti, TiN, TiAlN, TiCN, TiSiN, TiON, Ta, TaN, TaAlN, TaCN, TaSiN, C, CN, CoSi, CoSiN, Ni, Al, Cu, or a combination thereof.

Figure 29:
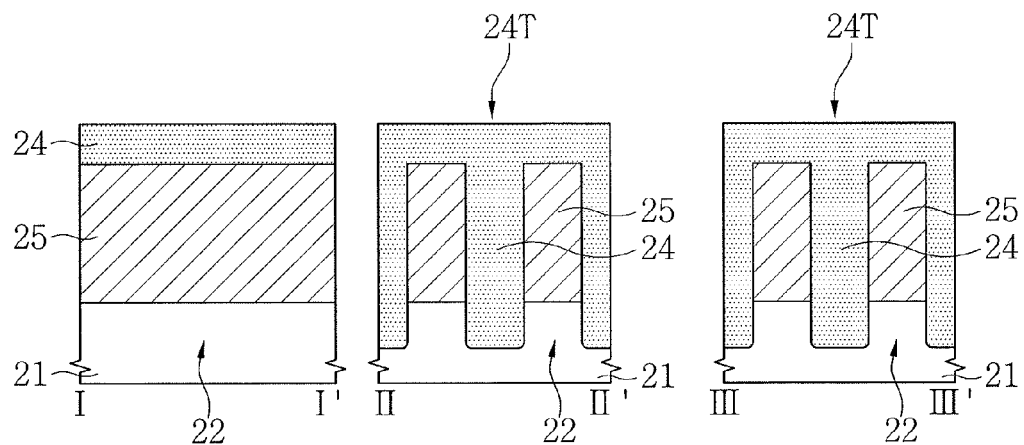
FIGS. 29 to 36 illustrate views along section lines I-I', II-II', and III-III' in FIG. 3.
Figure 36:
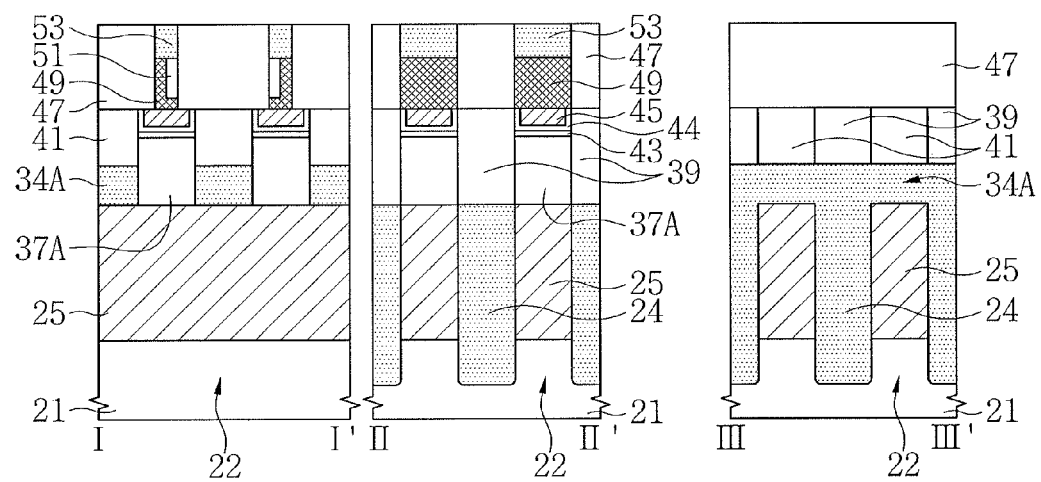

FIGS. 29 and 36 illustrate cross-sectional views taken along lines I-I', II-II' and III-III' of FIG. 3 in accordance with another embodiment of forming a non-volatile memory device. Referring to FIGS. 3 and 29, active regions 22, word-lines 25, trenches 24T, and a second insulating layer 24 may be formed on a substrate 21. The second insulating layer 24 may fully fill the trenches 24T, and cover upper surfaces of the word-lines 25.

Figure 30A:
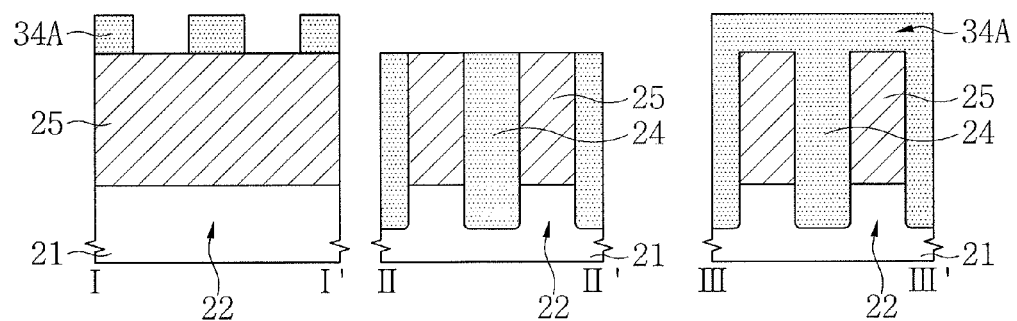

Referring to FIGS. 3 and 30A, the word-lines 25 may be exposed by patterning the second insulating layer 24. The second insulating layer 24 may be patterned by a photolithography process and an anisotropic etch process. The second insulating layer 24 may fill insides of the trenches 24T, and partially cover the word-lines 25. The second insulating layer 24 retained at a higher level than the word-lines 25 may function as first insulating patterns 34A. The first insulating patterns 34A may be parallel to each other. The first insulating patterns 34A may cross over the word-lines 25. The word-lines 25 may be exposed between the first insulating patterns 34A.

Figure 30B:
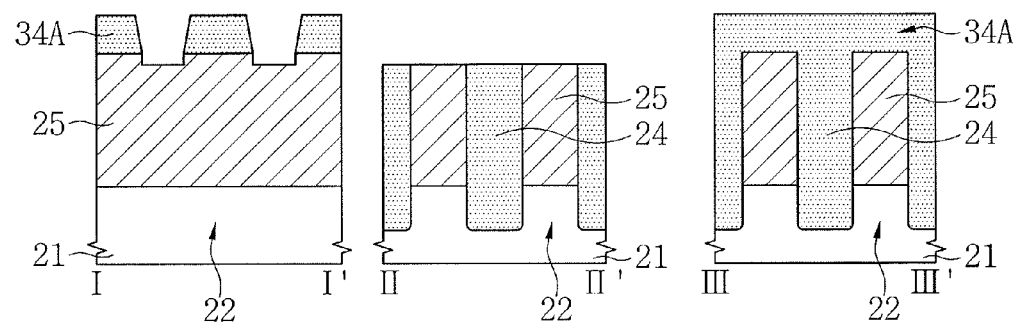

Referring to FIG. 30B, the formation of the first insulating patterns 34A may include an anisotropic etch process. The word-lines 25 may be partially recessed between the first insulating patterns 34A. Each of the first insulating patterns 34A may have a trapezoidal shape in which an upper horizontal width is smaller than a lower horizontal width.

Figure 31:
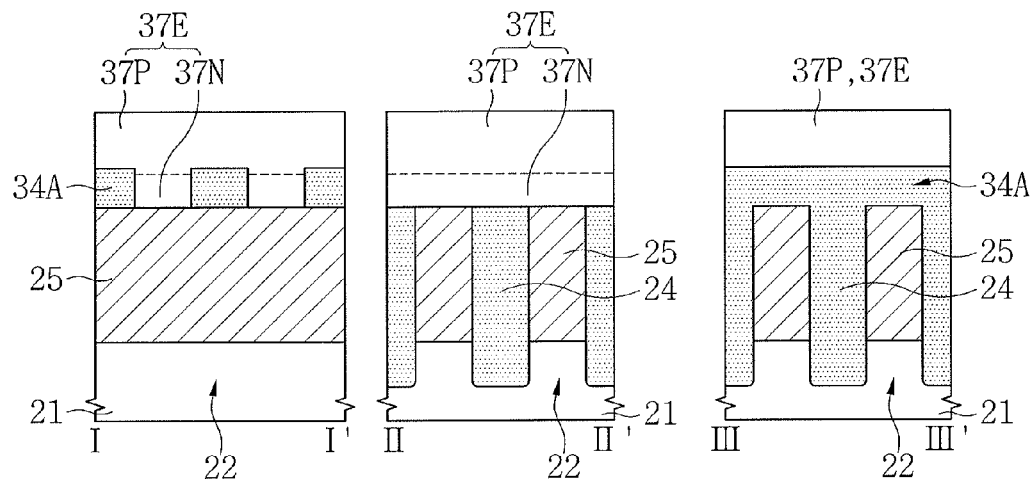

Referring to FIGS. 3 and 31, a diode layer 37E filling between the first insulating patterns 34A and covering the first insulating patterns 34A may be formed. The diode layer 37E may be in contact with the word-lines 25. The diode layer 37E may include a first region 37N and a second region 37P.

Figure 32:
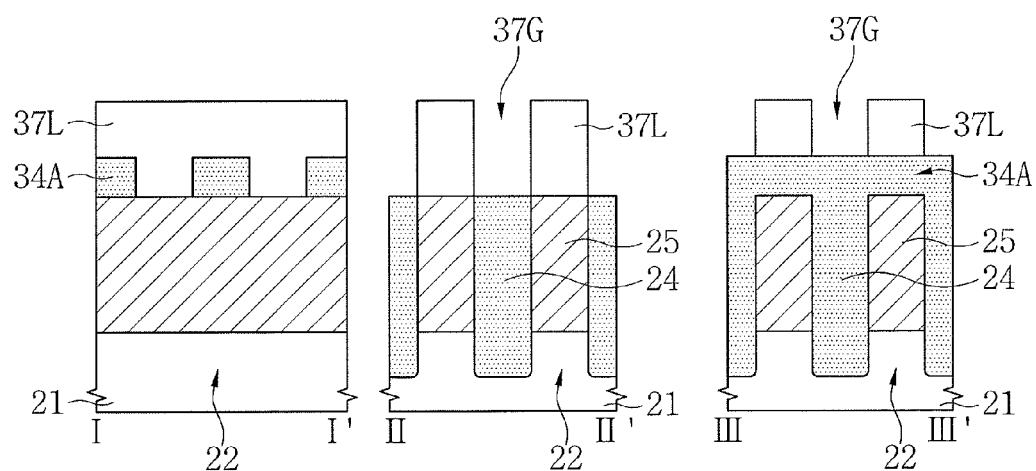

Referring to FIGS. 3 and 32, diode lines 37L may be formed by patterning the diode layer 37E. Grooves 37G may be formed between the diode lines 37L. The diode lines 37L may be parallel to each other. The diode lines 37L may cross the first insulating patterns 34A. The diode lines 37L may be parallel to the word-lines 25.

Figure 33:
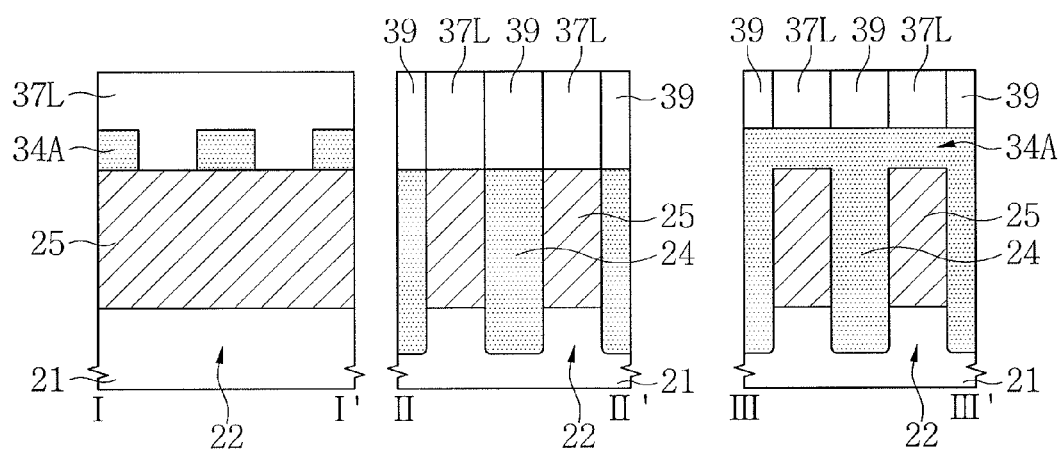

Referring to FIGS. 3 and 33, second insulating patterns 39 filling the grooves 37G may be formed. The formation of the second insulating patterns 39 may include a thin-film formation process and a planarization process.

Figure 34:
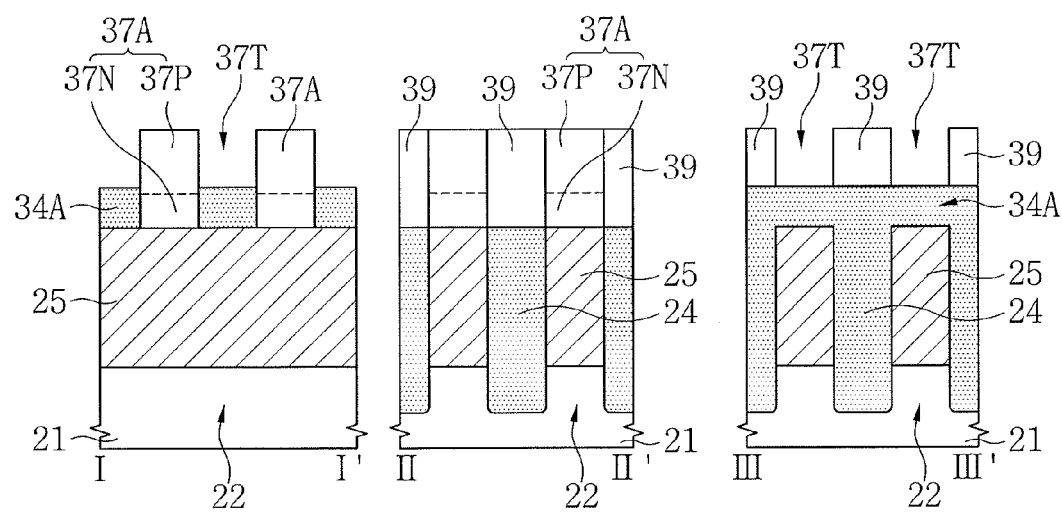

Referring to FIGS. 3 and 34, diodes 37A may be formed by patterning the diode lines 37L. Upper trenches 37T may be formed between the diodes 37A. The diodes 37A may be in contact with the word-lines 25.

Figure 35A:
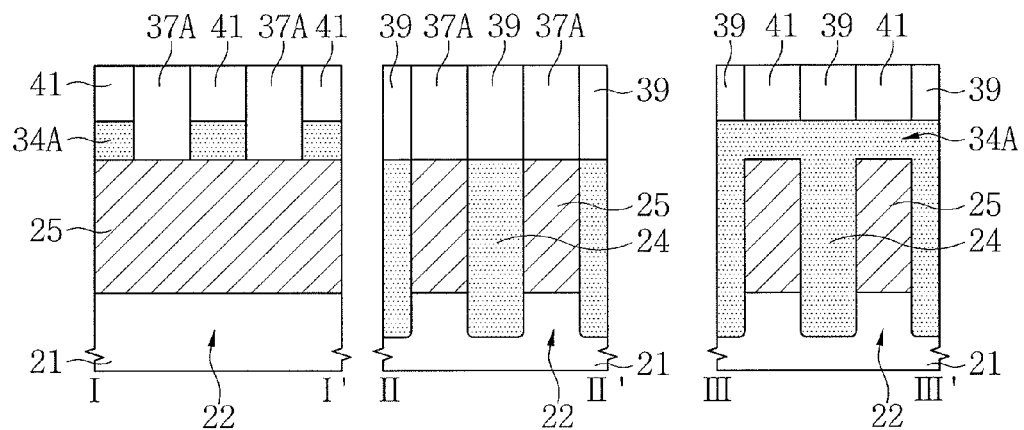

Referring to FIGS. 3 and 35A, third insulating patterns 41 may formed to fill the upper trenches 37T. The formation of the third insulating patterns 41 may include a thin-film formation process and a planarization process.

Figure 35B:
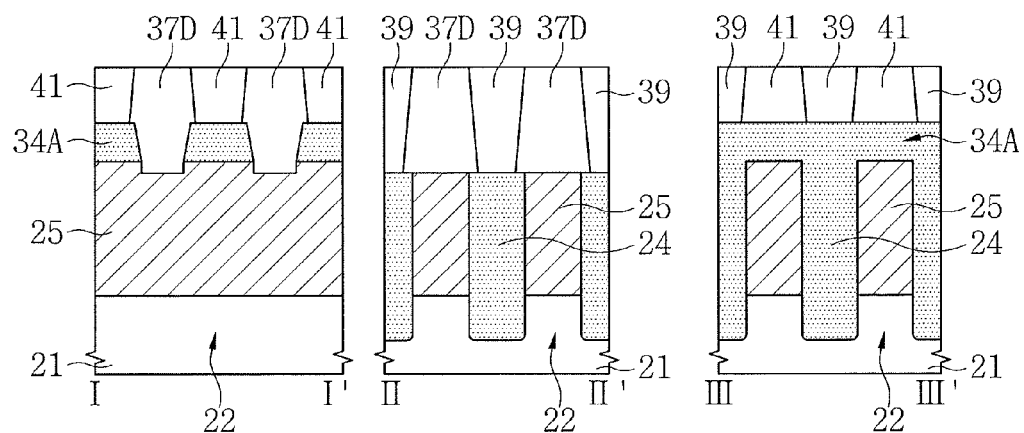

Referring to FIG. 35B, each of the first insulating patterns 34A may have a trapezoidal shape in which an upper horizontal width is smaller than a lower horizontal width. Each of the second insulating patterns 39 may have an inverted trapezoidal shape in which an upper horizontal width is greater than a lower horizontal width. Side surfaces of the diodes 37D may have different profiles from each other. Bottoms of the diodes 37D may be formed at a lower level than upper ends of the word-lines 25.

Referring to FIGS. 3, 12, and 36, metal silicide patterns 43 may be formed on the diodes 37A. Barrier metal patterns 44 and conductive patterns 45 may be sequentially formed on the metal silicide patterns 43. A molding layer 47 may be formed on the second insulating patterns 39 and the third insulating patterns 41. Data storage elements 49, 51, and 53 may be formed to pass through the molding layer 47. Upper insulating layer 59 may be formed on the molding layer 47. Upper electrodes 55 and bit-lines 57 connected to the data storage elements 49, 51, and 53 may be formed in the upper insulating layer 59.

FIGS. 37 to 41 illustrate cross-sectional views taken along lines I-I', II-II', and III-III' of FIG. 3, for describing another embodiment of a method of forming a non-volatile memory device.

Figure 37:
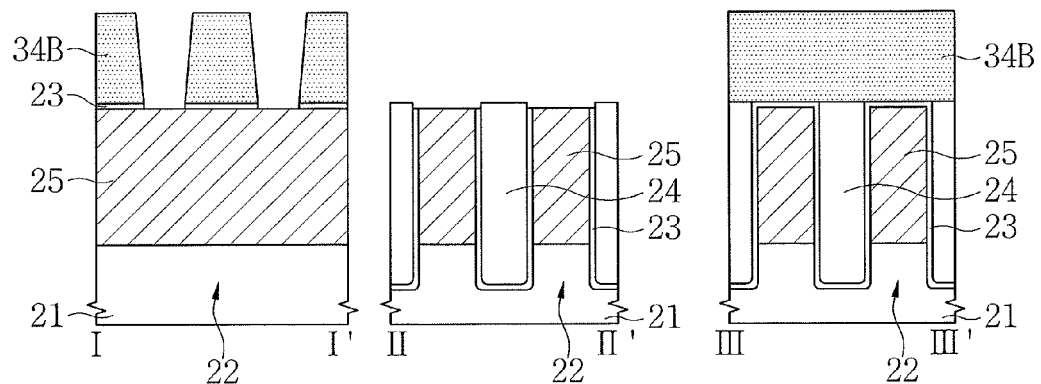
FIGS. 37 to 41 illustrate views along section lines I-I', II-II', and III-III' in FIG. 3.

Referring to FIGS. 3 and 37, active regions 22, word-lines 25, a first insulating layer 23, a second insulating layer 24, and first insulating patterns 34B may be formed on a substrate 21. The first insulating patterns 34B may be parallel to each other. The first insulating layer 23 may be retained between the first insulating patterns 34B and the word-lines 25. The word-lines 25 may be exposed between the first insulating patterns 34B. Each of the first insulating patterns 34B may have a trapezoidal shape in which an upper horizontal width is smaller than a lower horizontal width.

Figure 38:
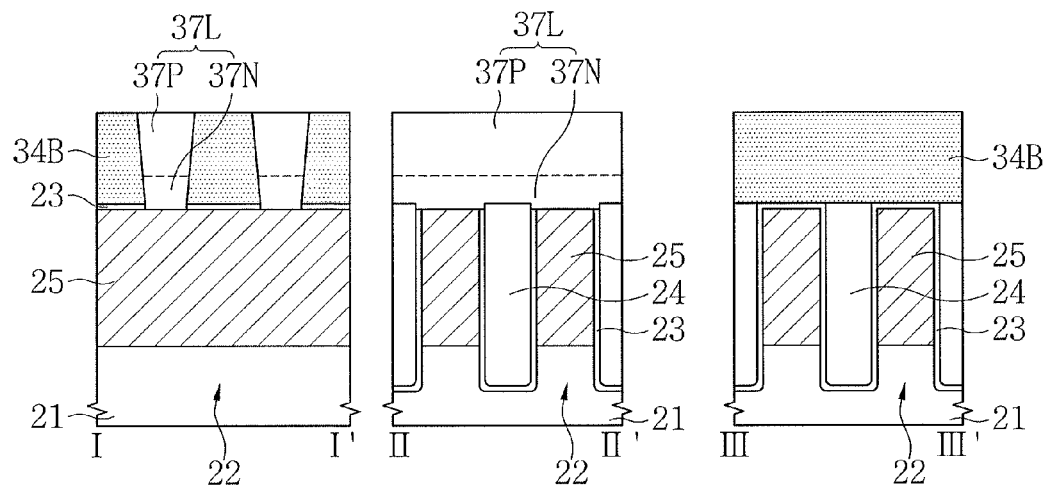

Referring to FIGS. 3 and 38, diode lines 37L may be formed to fill the first insulating patterns 34B. The diode lines 37L may be in contact with the word-lines 25. The formation of the diode lines 37L may include a thin-film formation process and a planarization process. Upper surfaces of the diode lines 37L and first insulating patterns 34B may be exposed substantially on the same plane. The diode lines 37L may be a semiconductor layer formed by an SEG process or a solid-phase epitaxial growth process. Each of the diode lines 37L may include a first region 37N and a second region 37P.

Figure 39:
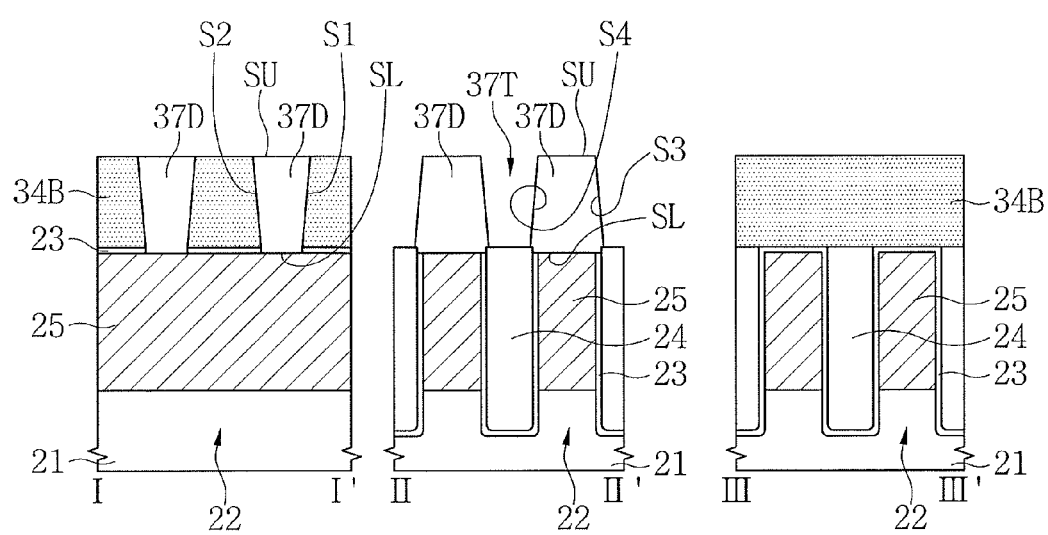

Referring to FIGS. 3 and 39, diodes 37D may be formed by patterning the diode lines 37L. Upper trenches 37T may be formed between the diodes 37D. The diodes 37D may be in contact with the word-lines 25.

Each of the diodes 37D may include a first side surface S1, a second side surface S2 facing the first side surface S1, a third side surface S3 disposed between the first side surface S1 and the second side surface S2, and a fourth side surface S4 facing the third side surface S3. The first side surface S1 and the second side surface S2 may be formed on the word-lines 25, and the third side surface S3 and the fourth side surface S4 may be formed on the second insulating layer 24. Additionally, the first side surface S1 and the second side surface S2 may have different profiles from the third side surface S3 and the fourth side surface S4.

Each of the diodes 37D may include a lower surface SL and an upper surface SU parallel to each other. The first side surface S1, second side surface S2, lower surface SL, and upper surface SU of the diodes 37D may have an inverted trapezoidal shape. The third side surface S3, fourth side surface S4, lower surface SL, and upper surface SU of the diodes 37D may have a trapezoidal shape.

Figure 40:
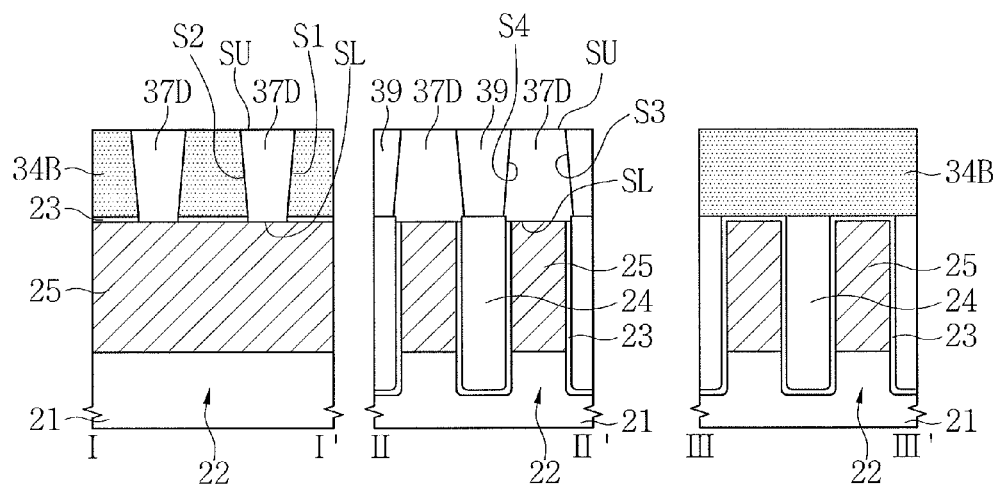

Referring to FIGS. 3 and 40, second insulating patterns 39 may be formed to fill the upper trenches 37T. The formation of the second insulating patterns 39 may include a thin-film formation process and a planarization process. The first side surface S1 and the second side surface S2 may be in contact with the first insulating patterns 34B, and the third side surface S3 and the fourth side surface S4 may be in contact with the second insulating patterns 39. Each of the second insulating patterns 39 may have an inverted trapezoidal shape in which an upper horizontal width is greater than a lower horizontal width.

Figure 41:
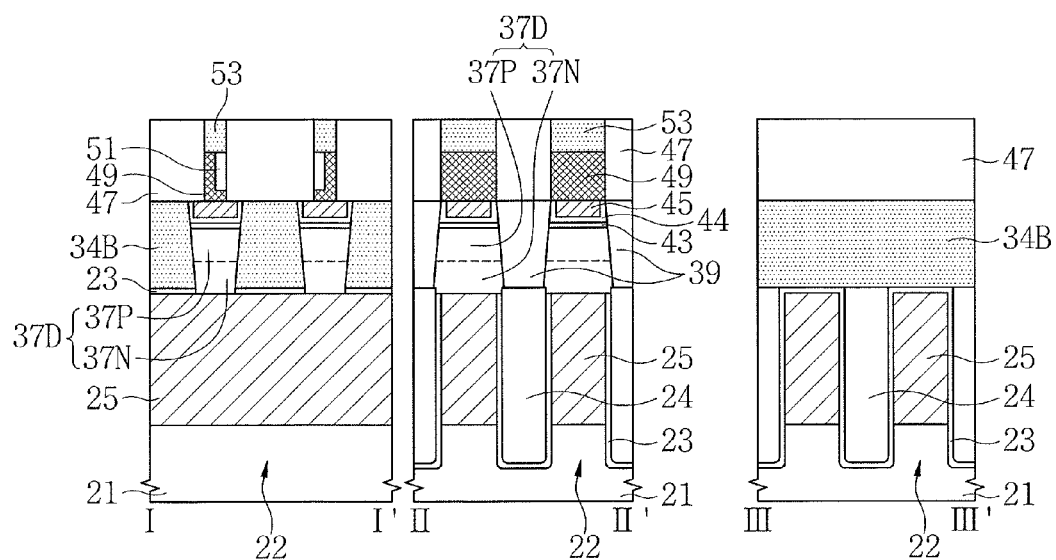

Referring to FIGS. 3, 15, and 41, metal silicide patterns 43 may be formed on the diodes 37D. Barrier metal patterns 44 and conductive patterns 45 may be sequentially formed on the metal silicide patterns 43. A molding layer 47 may be formed on the first insulating patterns 34B and the second insulating patterns 39. Data storage elements 49, 51, and 53 passing through the molding layer 47 may be formed. Upper insulating layer 59 may be formed on the molding layer 47. Upper electrodes 55 and bit-lines 57 connected to the data storage elements 49, 51, and 53 may be formed in the upper insulating layer 59.

Figure 42:
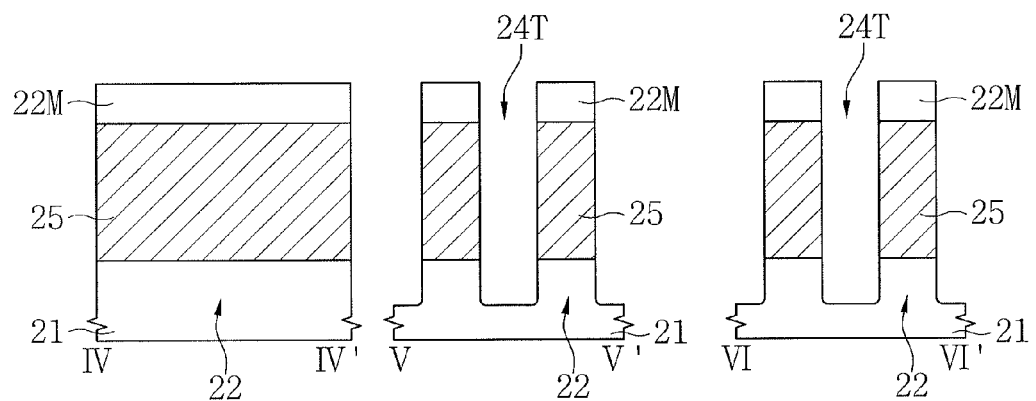
FIGS. 42 to 50 illustrate views along section lines IV-IV', V-V', and VI-VI' of FIG. 16.

FIGS. 42 to 50 illustrate cross-sectional views taken along lines IV-IV', V-V', and VI-VI' of FIG. 16 in accordance with one embodiment of a method of forming a non-volatile memory device. Referring to FIGS. 16 and 42, active regions 22, word-lines 25, mask patterns 22M, and trenches 24T may be formed on a substrate 21.

Figure 43:
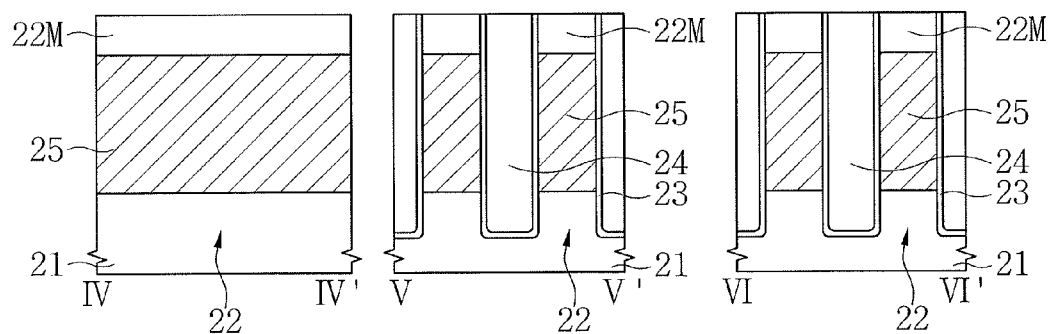

Referring to FIGS. 16 and 43, a first insulating layer 23 and second insulating layer 24 filling the trenches 24T may be sequentially formed. The first insulating layer 23 may surround side and bottom surfaces of the second insulating layer 24.

Figure 44:
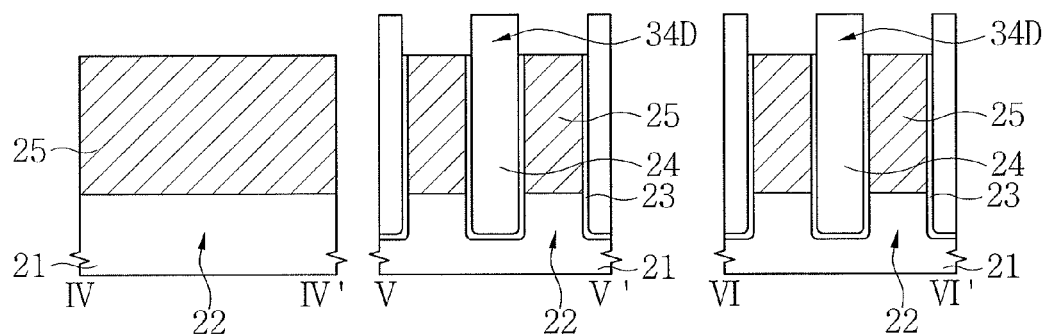

Referring to FIGS. 16 and 44, the word-lines 25 may be exposed by removing the mask patterns 22M. The first insulating layer 23 may be retained at a lower level than upper ends of the word-lines 25. The second insulating layer 24 may protrude at a higher level than the word-lines 25. Portions of the second insulating layer 24 protruding at the higher level than the word-lines 25 may function as first insulating patterns 34D. The first insulating patterns 34D may be parallel to each other. The first insulating patterns 34D may be aligned between the word-lines 25. The word-lines 25 may be exposed between the first insulating patterns 34D.

Figure 45:
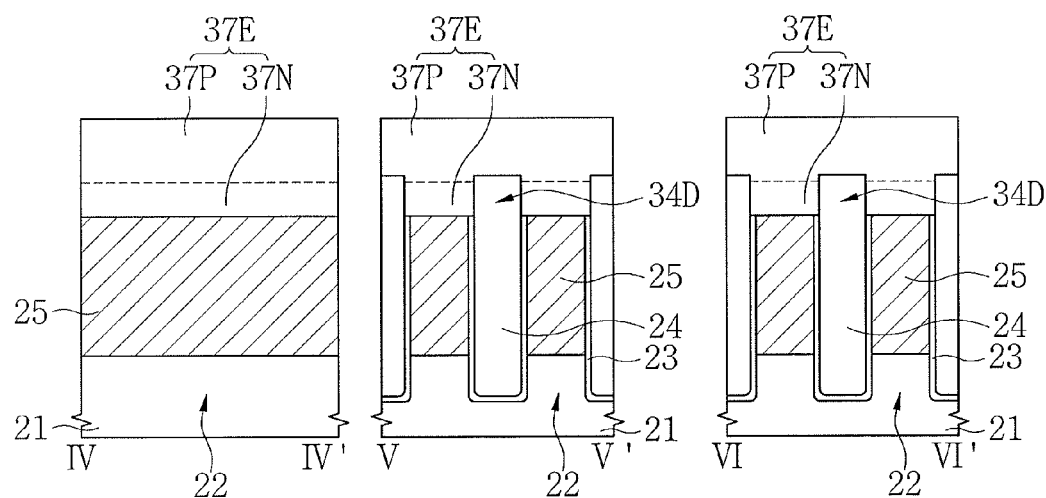

Referring to FIGS. 16 and 45, a diode layer 37E may be formed to fill the first insulating patterns 34D and covering the first insulating patterns 34D. The diode layer 37E may be in contact with the word-lines 25.

Figure 46:
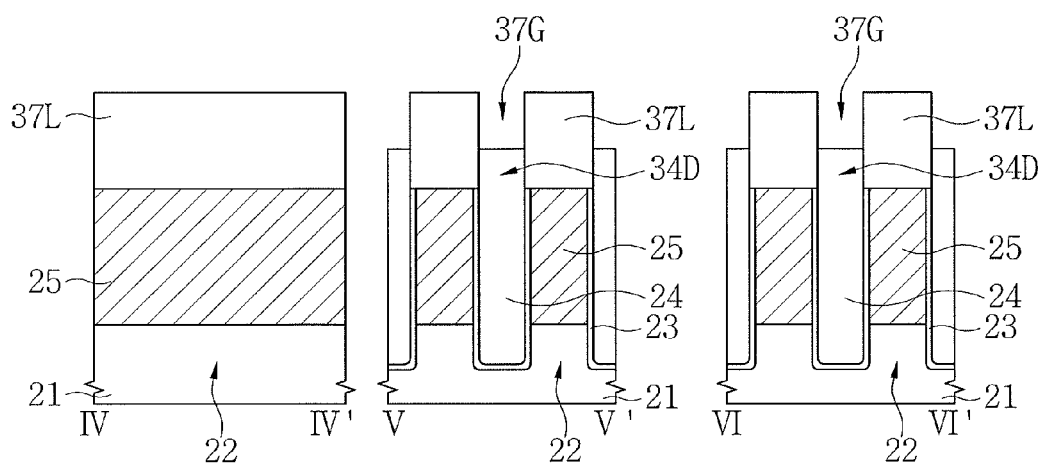

Referring to FIGS. 16 and 46, diode lines 37L may be formed by patterning the diode layer 37E. Grooves 37G may be formed between the diode lines 37L. The diode lines 37L may be parallel to each other. The first insulating patterns 34D may be exposed on bottoms of the grooves 37G. The diode lines 37L may be formed on the word-lines 25. The diode lines 37L may be parallel to the word-lines 25.

Figure 47:
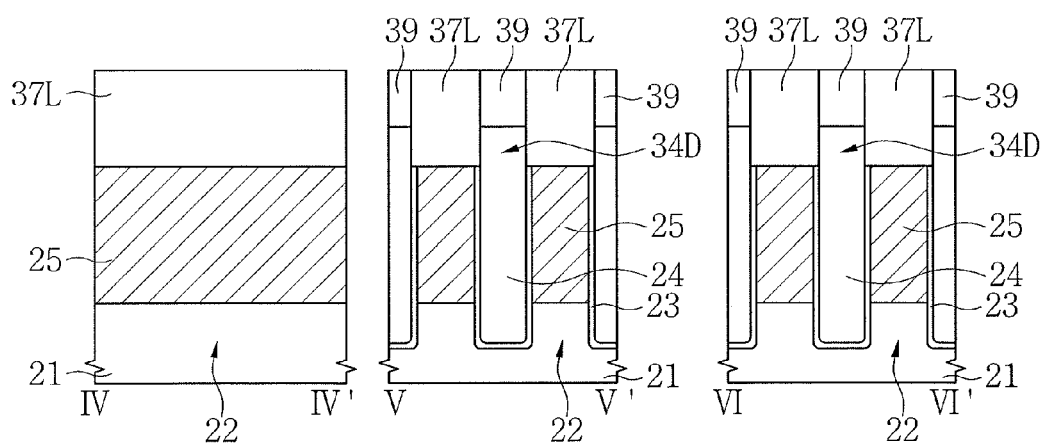

Referring to FIGS. 16 and 47, second insulating patterns 39 filling the grooves 37G may be formed.

Figure 48:
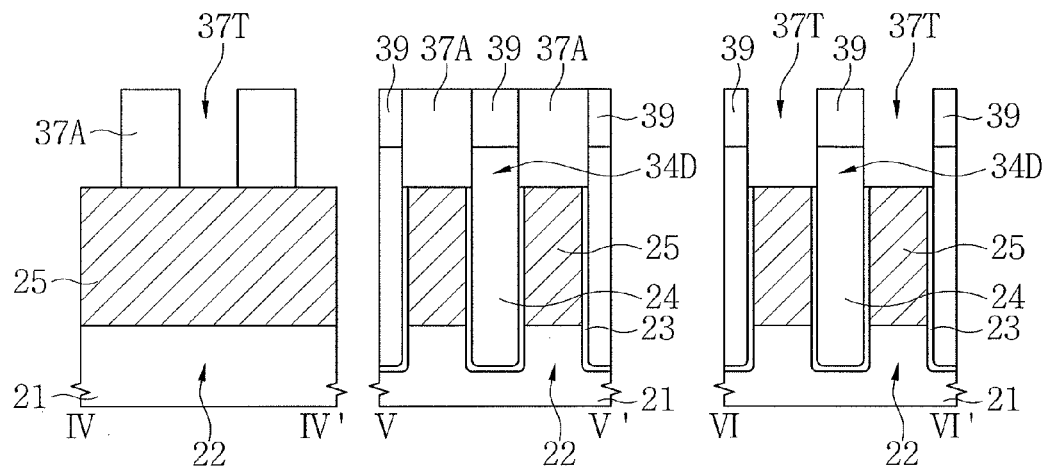

Referring to FIGS. 16 and 48, diodes 37A may be formed by patterning the diode lines 37L. Upper trenches 37T may be formed between the diodes 37A.

Figure 49:
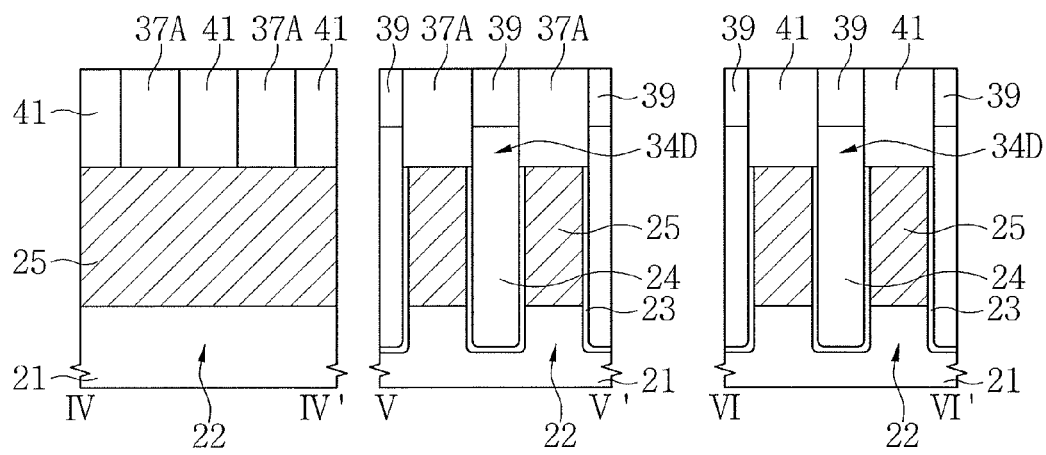

Referring to FIGS. 16 and 49, third insulating patterns 41 filling the upper trenches 37T may be formed. The formation of the third insulating patterns 41 may include a thin-film formation process and a planarization process.

Figure 50:
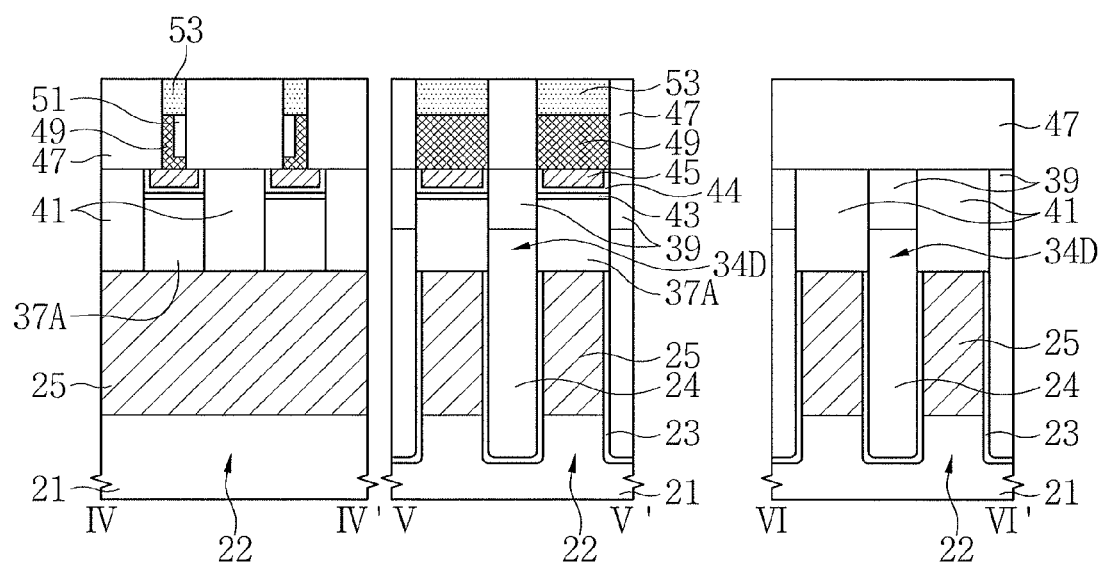

Referring to FIGS. 16, 17, and 50, metal silicide patterns 43 may be formed on the diodes 37A. Barrier metal patterns 44 and conductive patterns 45 may be sequentially formed on the metal silicide patterns 43. A molding layer 47 may be formed on the second insulating patterns 39 and the third insulating patterns 41. Data storage elements 49, 51, and 53 passing through the molding layer 47 may be formed. An upper insulating layer 59 may be formed on the molding layer 47. Upper electrodes 55 and bit-lines 57 connected to the data storage elements 49, 51, and 53 may be formed in the upper insulating layer 59.

Figure 51:
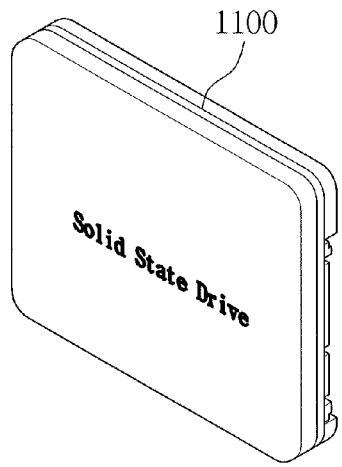
FIGS. 51 to 56 illustrate electronic apparatuses in accordance with various embodiments.
Figure 52:
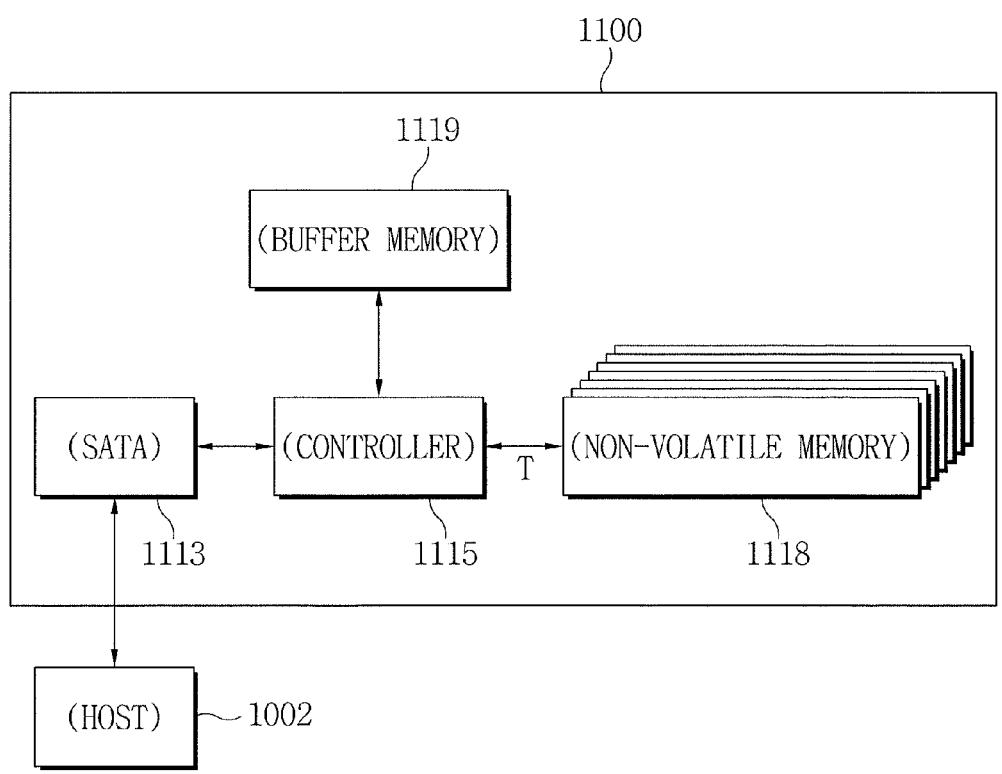

FIG. 51 illustrates a perspective view showing one embodiment of an electronic apparatus, and FIG. 52 illustrates a system block diagram of the electronic apparatus. The electronic apparatus may be a data storage device, such as a solid state drive (SSD) 1100.

Referring to FIGS. 51 and 52, the SSD 1100 may include an interface 1113, a controller 1115, a non-volatile memory 1118, and a buffer memory 1119. The SSD 1100 may be an apparatus that stores information using a semiconductor device. The SSD 1100 is faster, has a lower mechanical delay or failure rate, and generates less heat and noise than a hard disk drive (HDD). Further, the SSD 1100 may be smaller and lighter than the HDD. The SSD 1100 may be widely used, for example, in a laptop computer, a netbook, a desktop PC, an MP3 player, or a portable storage device.

The controller 1115 may be formed close to the interface 1113 and electrically connected thereto. The controller 1115 may be a microprocessor including a memory controller and a buffer controller. The non-volatile memory 1118 may be formed close to the controller 1115 and electrically connected thereto. Data storage capacity of the SSD 1100 may correspond to the capacity of the non-volatile memory 1118. The buffer memory 1119 may be formed close to the controller 1115 and electrically connected thereto.

The interface 1113 may be connected to a host 1002, and may send and receive electrical signals, such as data. For example, the interface 1113 may be a device using a standard such as a Serial Advanced Technology Attachment (SATA), an Integrated Drive Electronics (IDE), a Small Computer System Interface (SCSI), and/or a combination thereof. The non-volatile memory 1118 may be connected to the interface 1113 via the controller 1115. The non-volatile memory 1118 may function to store data received through the interface 1113. Even when power supplied to the SSD 1100 is interrupted, the data stored in the non-volatile memory 1118 may be retained.

The buffer memory 1119 may include a volatile memory. The volatile memory may be a dynamic random access memory (DRAM) and/or a static random access memory (SRAM). The buffer memory 1119 has a relatively faster operating speed than the non-volatile memory 1118.

Data processing speed of the interface 1113 may be relatively faster than the operating speed of the non-volatile memory 1118. The buffer memory 1119 may function to temporarily store data. The data received through the interface 1113 may be temporarily stored in the buffer memory 1119 via the controller 1115, and then permanently stored in the non-volatile memory 1118 according to the data write speed of the non-volatile memory 1118. Further, frequently-used items of the data stored in the non-volatile memory 1118 may be pre-read and temporarily stored in the buffer memory 1119. That is, the buffer memory 1119 may function to increase effective operating speed of the SSD 1100, and reduce error rate.

The non-volatile memory 1118 may have a configuration as described with reference to FIGS. 1 to 50. For example, the non-volatile memory 1118 may include the first insulating patterns (reference numeral 34 in FIG. 1) and the diode (reference numeral 37A in FIG. 1).

Figure 53:
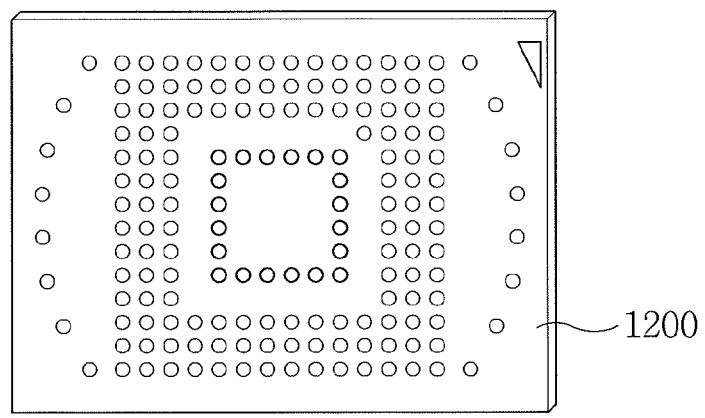
Figure 54:
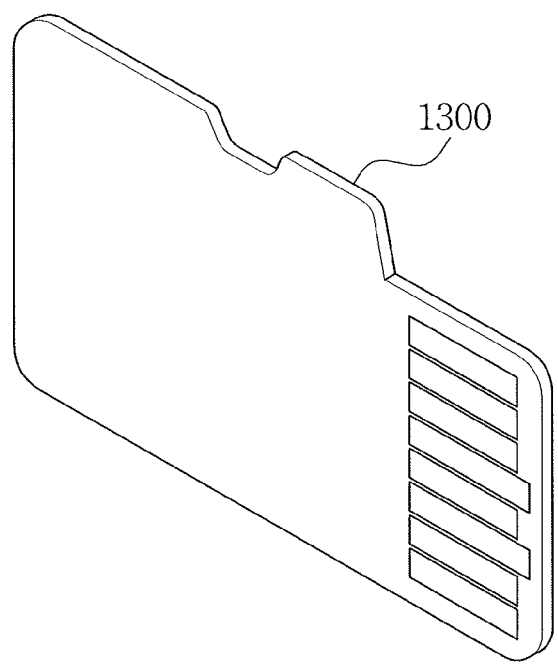
Figure 55:
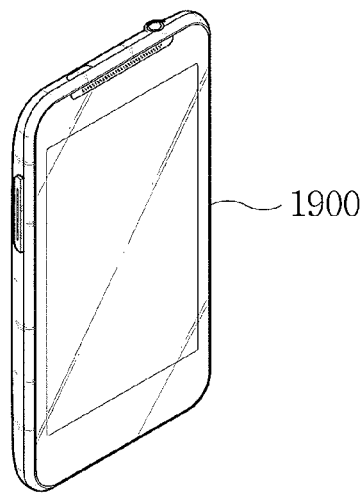
Figure 56:
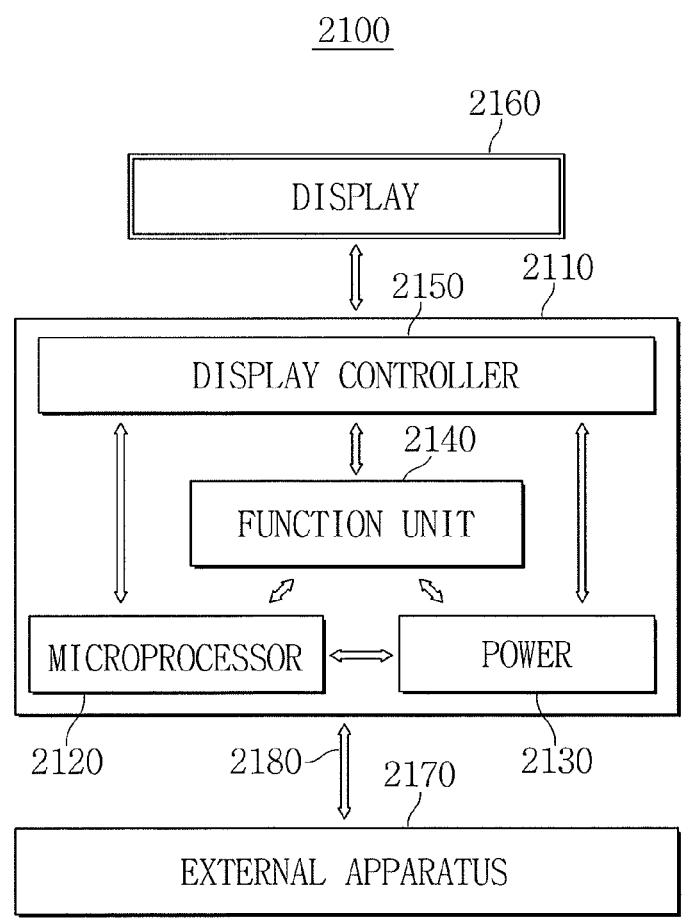

FIGS. 53 to 55 illustrate perspective views showing other embodiments of electronic apparatuses, and FIG. 56 illustrates a system block diagram of one or more of the embodiments of the electronic apparatuses.

Referring to FIGS. 53 to 55, the semiconductor device described with reference to FIGS. 1 to 50 may be usefully applied to electronic systems, such as an embedded multimedia chip (eMMC) 1200, a micro SD 1300, a smart phone 1900, a netbook, a laptop computer, or a tablet PC. For example, the semiconductor device as described with reference to FIGS. 1 to 50 may be installed in a mainboard of the smart phone 1900. The semiconductor device as described with reference to FIGS. 1 to 50 may be provided to an expansion apparatus, such as the micro SD 1300, to be used combined with the smart phone 1900.

Referring to FIG. 56, the semiconductor device as described with reference to FIGS. 1 to 50 may be applied to an electronic system 2100. The electronic system 2100 may include a body 2110, a microprocessor unit 2120, a power unit 2130, a function unit 2140, and a display controller unit 2150. The body 2110 may be a motherboard formed of a printed circuit board (PCB). The microprocessor unit 2120, the power unit 2130, the function unit 2140, and the display controller unit 2150 may be installed on the body 2110. A display unit 2160 may be arranged inside or outside of the body 2110. For example, the display unit 2160 may be arranged on a surface of the body 2110 and display an image processed by the display controller unit 2150.

The power unit 2130 may receive a constant voltage from an external battery (not shown), etc., divide the voltage into various levels, and supply those voltages to the microprocessor unit 2120, the function unit 2140, and the display controller unit 2150, etc. The microprocessor unit 2120 may receive a voltage from the power unit 2130 to control the function unit 2140 and the display unit 2160. The function unit 2140 may perform various functions of the electronic system 2100. For example, when the electronic system 2100 is a mobile phone, the function unit 2140 may have several components which perform functions of the mobile phone such as output of an image to the display unit 2160 or output of a voice to a speaker, by dialing or communication with an external apparatus 2170. If a camera is installed, the function unit 2140 may function as a camera image processor.

In accordance with one embodiment, when the electronic system 2100 is connected to a memory card, etc. in order to expand capacity, the function unit 2140 may be a memory card controller. The function unit 2140 may exchange signals with the external apparatus 2170 through a wired or wireless communication unit 2180. In addition, when the electronic system 2100 needs a universal serial bus (USB), etc. in order to expand functionality, the function unit 2140 may function as an interface controller. Further, the function unit 2140 may include a mass storage apparatus.

The semiconductor device as described with reference to FIGS. 1 to 50 may be applied to the function unit 2140 or the microprocessor unit 2120. For example, the function unit 2140 may include the first insulating patterns (reference numeral 34 in FIG. 1) and the diode (reference numeral 37A in FIG. 1). The diode (reference numeral 37A in FIG. 1) may be electrically connected to the body 2110.

According to one or more embodiments, a word-line, a pair of first insulating patterns disposed on the word-line, and a diode disposed between the first insulating patterns may be provided. While performing a patterning process for forming the diode, the first insulating patterns may function to prevent generation of a Si-fence. A semiconductor device which has superior electrical characteristics and is suitable for high integration, can be implemented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a lower interconnection on a substrate;
   a diode on the lower interconnection;
   a pair of first insulating patterns adjacent to respective side surfaces of the diode, the pair of first insulating patterns spaced from one another; and
   a data storage element on the diode, wherein an upper end of the diode protrudes at a higher level than the pair of first insulating patterns and wherein the diode includes:
   a lower part between the pair of first insulating patterns; and
   an upper part at a higher level than the pair of first insulating patterns,
   wherein side surfaces of the lower part and upper part are offset relative to each other.

2. The semiconductor device as claimed in claim 1, wherein the pair of first insulating patterns cross the lower interconnection.

3. The semiconductor device as claimed in claim 1, wherein each of the pair of first insulating patterns has an upper horizontal width smaller than a lower horizontal width.

4. The semiconductor device as claimed in claim 1, wherein:
   the pair of first insulating patterns cross over the lower interconnection, and
   a lower end of the diode is at a lower level than an upper end of the lower interconnection.

5. The semiconductor device as claimed in claim 1, wherein the diode includes a semiconductor layer formed by a selective epitaxial growth (SEG) process or a solid-phase epitaxial growth process.

6. The semiconductor device as claimed in claim 1, wherein:
   the lower part is substantially an inverted trapezoidal shape, and
   the upper part is substantially a trapezoidal shape.

7. The semiconductor device as claimed in claim 1, wherein the upper part is in contact with upper surfaces of the par of first insulating patterns.

8. A semiconductor device, comprising:
   a lower interconnection on a substrate;
   a diode on the lower interconnection;
   a pair of first insulating patterns adjacent to respective side surfaces of the diode, the pair of first insulating patterns spaced from one another;
   a data storage element on the diode, wherein an upper end of the diode protrudes at a higher level than the pair of first insulating patterns; and
   a pair of second insulating patterns crossing the pair of first insulating patterns and facing each other, wherein:
   the diode is between the pair of second insulating patterns,
   the diode includes first and second side surfaces facing each other and adjacent to the first insulating patterns, and third and fourth side surfaces facing each other and adjacent to the second insulating patterns, and
   the first and second side surfaces have different slopes from the third and fourth side surfaces.

9. The semiconductor device as claimed in claim 8, wherein:
   the first side surface includes a lower side surface and an upper side surface on the lower side surface, and
   the lower side surface is in contact with a side surface of one of the first insulating patterns, and
   the upper side surface is at a higher level than the first insulating patterns.

10. The semiconductor device as claimed in claim 8, wherein each of the pair of second insulating patterns has an upper horizontal width smaller than a lower horizontal width.

11. The semiconductor device as claimed in claim 8, further comprising:
    third insulating patterns on the pair of first insulating patterns and adjacent to the first and second side surfaces, wherein side surfaces of the third insulating patterns have different slopes from the pair of first insulating patterns.

12. A semiconductor device, comprising:
    a lower interconnection on a substrate;
    a pair of first insulating patterns facing each other on the lower interconnection;
    a semiconductor pattern disposed between the first insulating patterns;

a pair of second insulating patterns crossing the pair of first insulating patterns and facing each other; and an upper interconnection on the semiconductor pattern, wherein the semiconductor pattern includes first and second side surfaces in contact with the pair of first insulating patterns and facing each other, and third and fourth side surfaces in contact with the pair of second insulating patterns and facing each other, the first and second side surfaces having different slopes from the third and fourth side surfaces.

13. The semiconductor device as claimed in claim 12, wherein:

each of the pair of first insulating patterns has an upper horizontal width smaller than a lower horizontal width, and each of the pair of second insulating patterns has an upper horizontal width greater than a lower horizontal width.

14. The semiconductor device as claimed in claim 12, wherein:

the semiconductor pattern has an upper horizontal width greater than a lower horizontal width when viewed in a first cross-section passing through the first and second side surfaces, and has an upper horizontal width smaller than a lower horizontal width when viewed in a second cross-section passing through the third and fourth side surfaces.

15. A semiconductor device, comprising:

a conductive line;

a diode on the conductive line;

one or more insulating patterns adjacent to diode; and a data storage region coupled to the diode, wherein an upper surface of the diode is adjacent the one or more insulating patterns and the data storage region, and wherein:

the diode tapers from a first width to a second width in a first direction, and the diode tapers from a third width to a fourth width in a second direction opposite to the first direction, the first and second directions substantially aligned with an upper surface of the one or more insulating patterns.

16. The semiconductor device as claimed in claim 15, wherein the one or more insulating patterns include a first insulating pattern and a second insulating pattern, and wherein the diode is between the first and second insulating patterns.

17. The semiconductor device as claimed in claim 16, wherein upper surfaces of the first and second insulating patterns are substantially coplanar.

18. The semiconductor device as claimed in claim 15, wherein the data storage region includes a phase-change region.

* * * * *